United States Patent
Nagaoka et al.

(10) Patent No.: US 10,311,189 B2
(45) Date of Patent: Jun. 4, 2019

(54) SIMULATION METHOD AND SIMULATION APPARATUS

(71) Applicant: FUJITSU LIMITED, Kawasaki-shi, Kanagawa (JP)

(72) Inventors: Hideaki Nagaoka, Atsugi (JP); Taiga Fukumori, Isehara (JP); Daisuke Mizutani, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 1273 days.

(21) Appl. No.: 14/248,422

(22) Filed: Apr. 9, 2014

(65) Prior Publication Data
US 2014/0350901 A1    Nov. 27, 2014

(30) Foreign Application Priority Data
May 22, 2013   (JP) .................. 2013-108199

(51) Int. Cl.
*G06F 17/10* (2006.01)
*G06F 17/50* (2006.01)
(Continued)

(52) U.S. Cl.
CPC ....... *G06F 17/5068* (2013.01); *H05K 1/0366* (2013.01); *H05K 1/0245* (2013.01);
(Continued)

(58) Field of Classification Search
CPC ............ H01L 2223/6627; H01L 23/66; H05K 1/0245; H05K 1/0366; H05K 1/0248;
(Continued)

(56) References Cited

U.S. PATENT DOCUMENTS 6,291,254 B1 * 9/2001 Chou ............... H01L 22/34
257/14
7,289,945 B2 * 10/2007 Jiao ............... G06F 17/5018
703/14

(Continued)

FOREIGN PATENT DOCUMENTS

JP    2009-015678    1/2009
JP    2011-082271    4/2011

OTHER PUBLICATIONS

Neves JL, Friedman EG, "Optimal clock skew scheduling tolerant to process variations." Proceedings of the 33rd annual Design Automation Conference 1996 (ACM), Jun. 1, 1996, pp. 623-628.*

(Continued)

*Primary Examiner* — Andre Pierre Louis
(74) *Attorney, Agent, or Firm* — Fujitsu Patent Center

(57) ABSTRACT

Three-dimensional electromagnetic field analysis is performed for a plurality of positional patterns of a first wiring board internal structure model including one glass cloth on the upper side of differential lines and also for a plurality of positional patterns of a second wiring board internal structure model including one glass cloth on the lower side of differential lines to calculate skews, and the calculated skews are summed relating to a plurality of wiring board patterns configured by combining a plurality of combination patterns obtained by combining the plurality of positional patterns of the first model and a plurality of combination patterns obtained by combining the plurality of positional patterns of the second model to calculate a total skew and then a skew distribution in a wiring board having a certain line length is acquired based on the total skew.

16 Claims, 19 Drawing Sheets

(51) Int. Cl.
*H05K 1/03* (2006.01)
*H05K 1/02* (2006.01)
*H05K 3/00* (2006.01)

(52) U.S. Cl.
CPC ......... *H05K 1/0248* (2013.01); *H05K 3/0005* (2013.01); *H05K 2201/029* (2013.01)

(58) Field of Classification Search
CPC ............ H05K 1/025; H05K 2201/029; H05K 2201/09236; H01P 3/026; Y10T 428/249921; Y10T 428/249986; Y10T 428/269; G06F 17/50; G06F 17/5018; G06F 17/5009; G06F 17/5068; G06F 17/5077; G06F 17/5081
USPC .................................................. 703/2, 13, 14
See application file for complete search history.

(56) References Cited

U.S. PATENT DOCUMENTS

| | | | | |
|---|---|---|---|---|
| 7,653,519 | B1* | 1/2010 | Overhauser | H01L 22/34 438/18 |
| 8,286,343 | B2 | 10/2012 | Suwada | |
| 8,572,530 | B1* | 10/2013 | Fung | G06F 1/10 716/100 |
| 2004/0181764 | A1* | 9/2004 | Brist | G06F 17/5077 174/258 |
| 2004/0262036 | A1* | 12/2004 | Brist | H05K 1/0248 174/261 |
| 2010/0116530 | A1* | 5/2010 | Okazaki | H05K 3/4688 174/257 |
| 2011/0308840 | A1* | 12/2011 | Ooi | H05K 1/0248 174/251 |

OTHER PUBLICATIONS

Harris D, Naffziger S, "Statistical clock skew modeling with data delay variations." IEEE Transactions on Very Large Scale Integration (VLSI) Systems. Dec. 2001, vol. 9, No. 6, pp. 888-898.*

Muraoka S, Shinkai G, Yagyu M, Uematsu Y, Ogihara M, Sezaki N, Osaka H. "PCB trace modeling and equalizer design method for 10 Gbps backplane." Electrical Design of Advanced Packaging and Systems Symposium (EDAPS), 2011 IEEE, Dec. 12, 2011, pp. 1-4.*

* cited by examiner

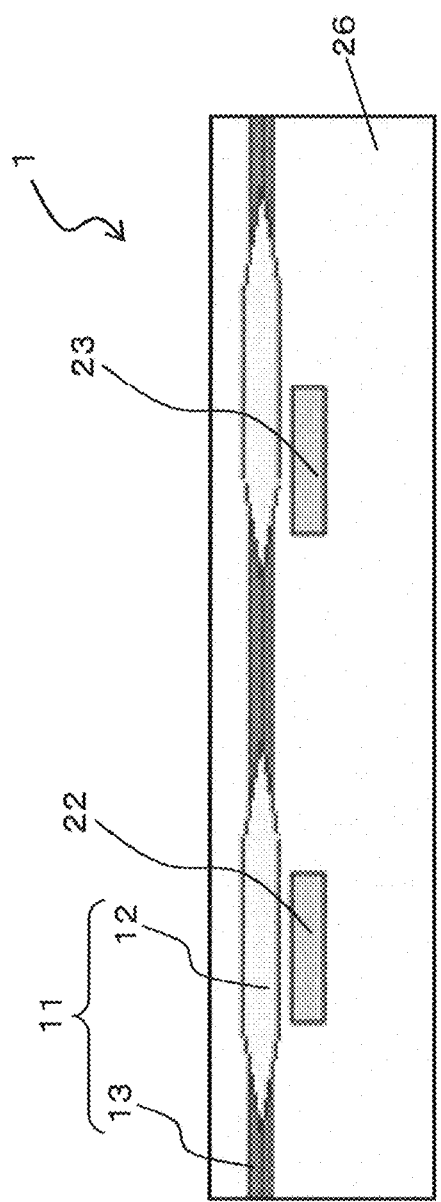
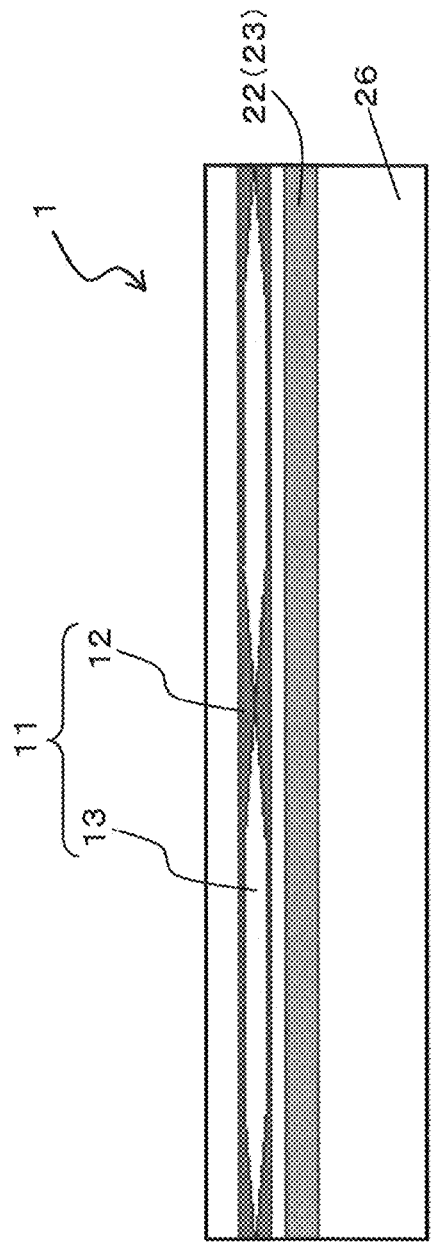

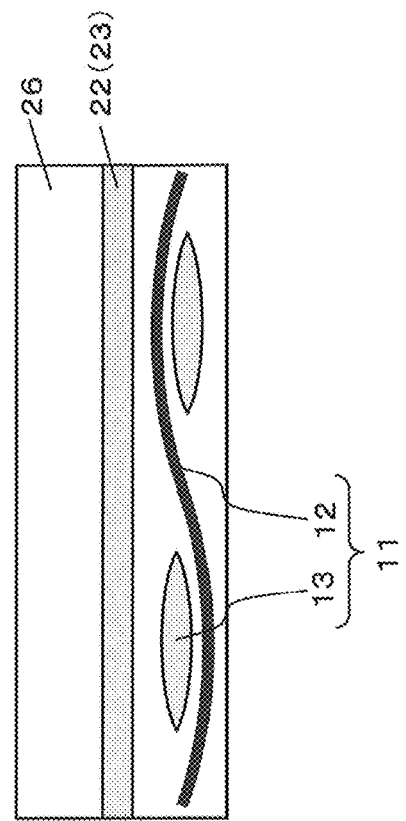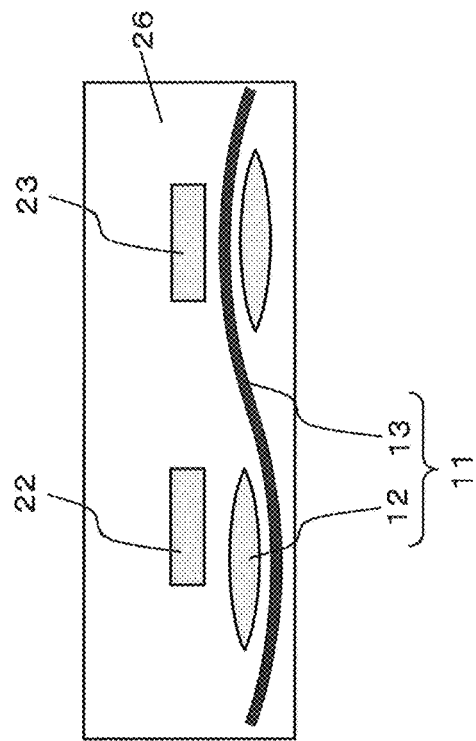

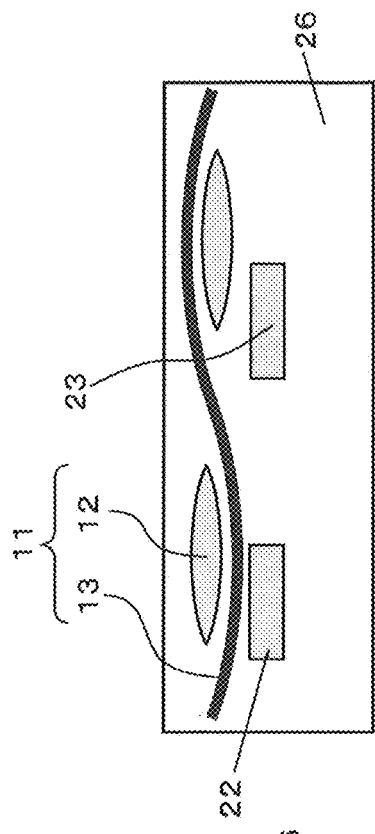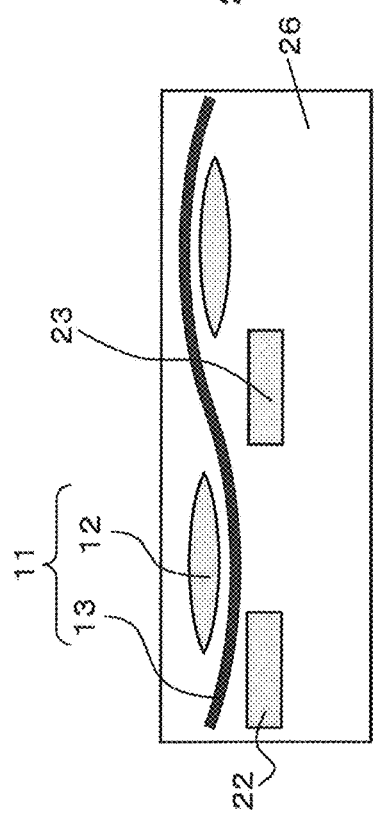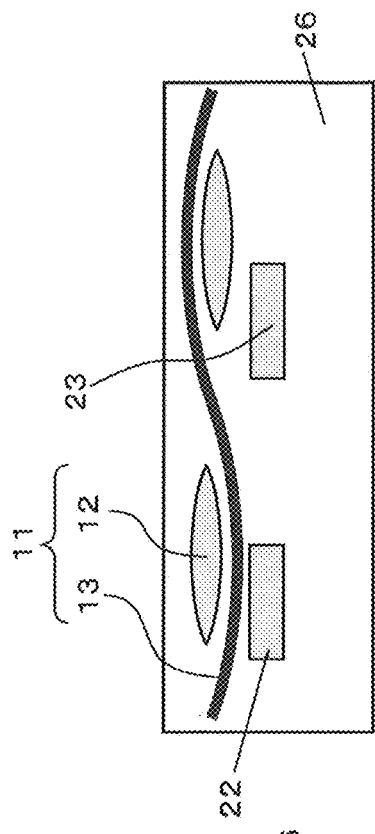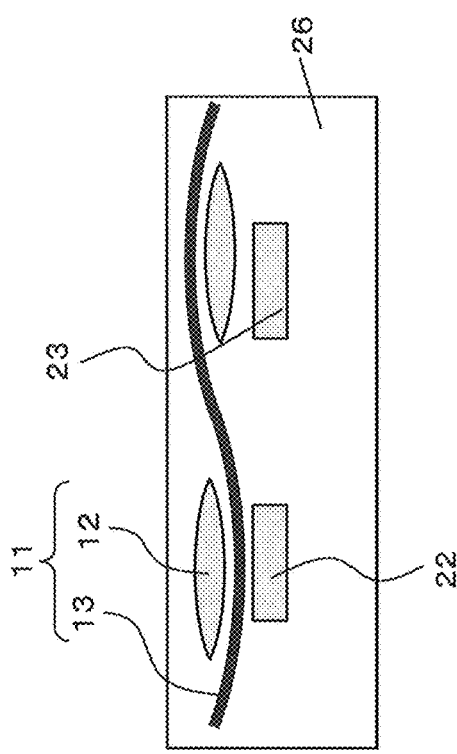

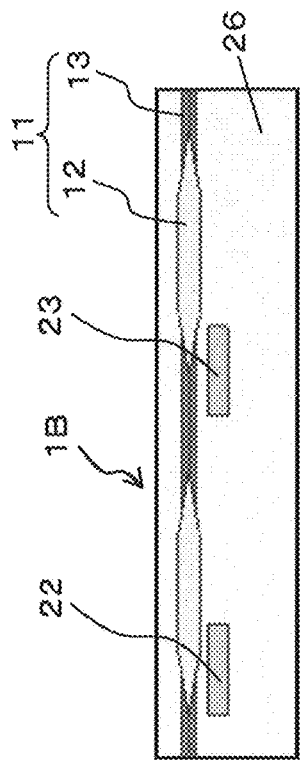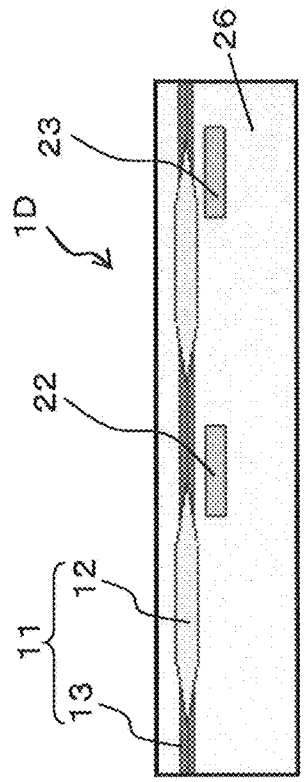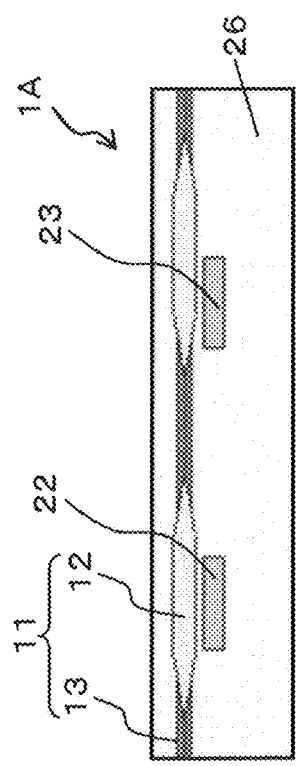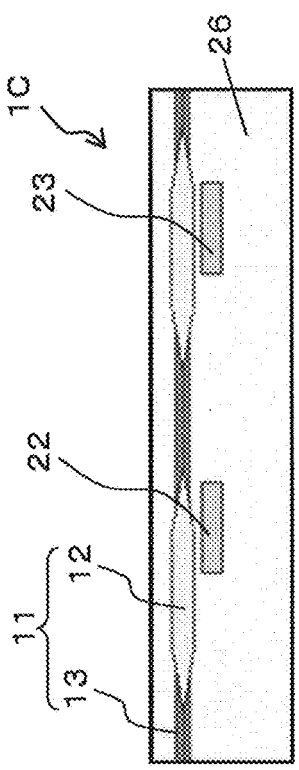

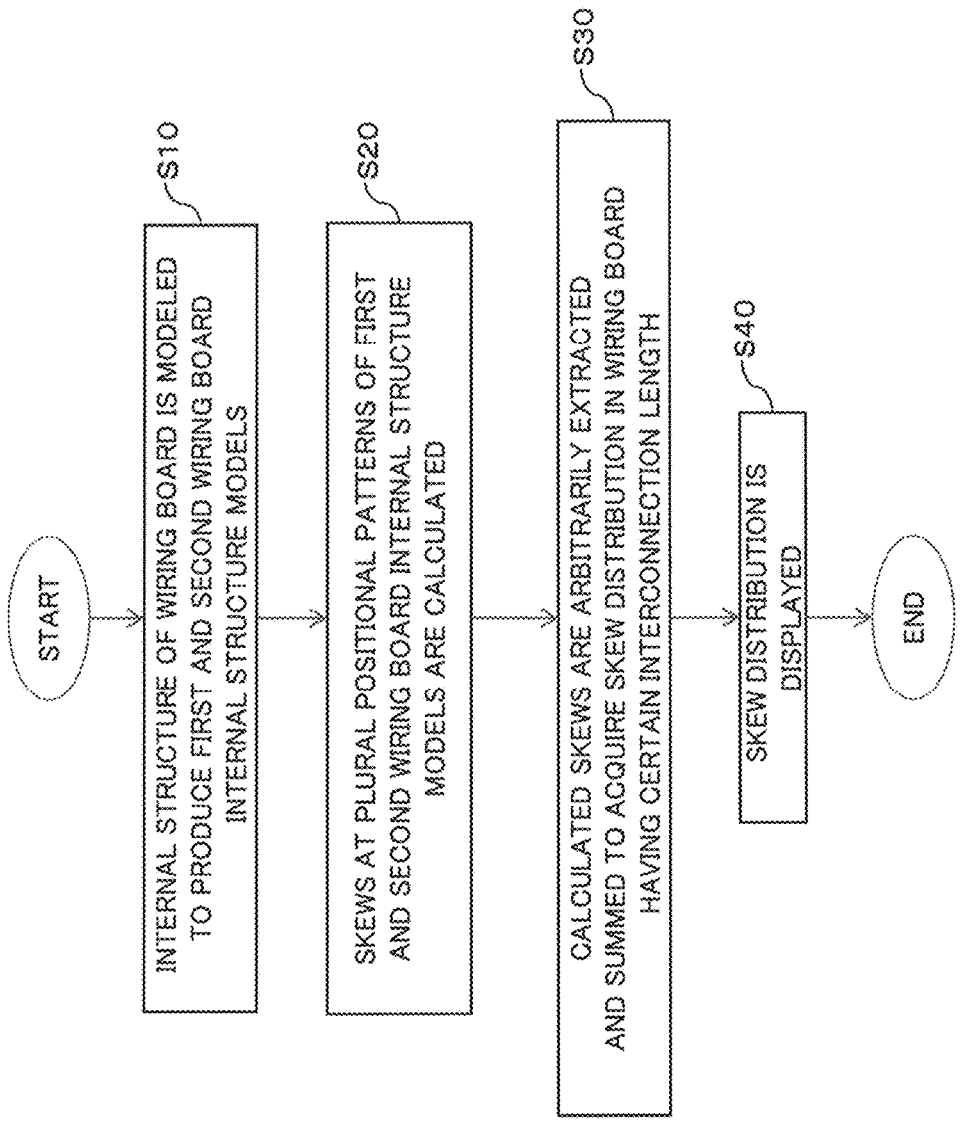

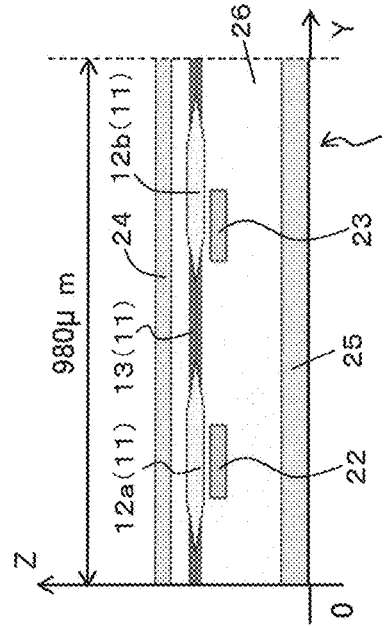

| | SHAPE | SIZE (WIDTH [μm] × HEIGHT [μm]) | CENTER COORDINATES (Y[μm], Z[μm]) |
|---|---|---|---|
| ONE DIFFERENTIAL INTERCONNECTION 22 | RECTANGULAR SOLID | 130 × 30 | 235, 163 |
| OTHER DIFFERENTIAL INTERCONNECTION 23 | RECTANGULAR SOLID | 130 × 30 | 665, 163 |
| ONE VERTICAL GLASS FIBER BUNDLE 12a IN FIRST GLASS CLOTH | HEXAGONAL POLE | 350 × 30 | 245, 205 |
| OTHER VERTICAL GLASS FIBER BUNDLE 12b IN FIRST GLASS CLOTH | HEXAGONAL POLE | 350 × 30 | 735, 205 |
| RESIN 26 | RECTANGULAR SOLID | 980 × 200 | 490, 150 |
| LOWER SIDE GROUND PLANE 25 | RECTANGULAR SOLID | 980 × 50 | 490, 25 |
| UPPER SIDE GROUND PLANE 24 | RECTANGULAR SOLID | 980 × 30 | 490, 265 |

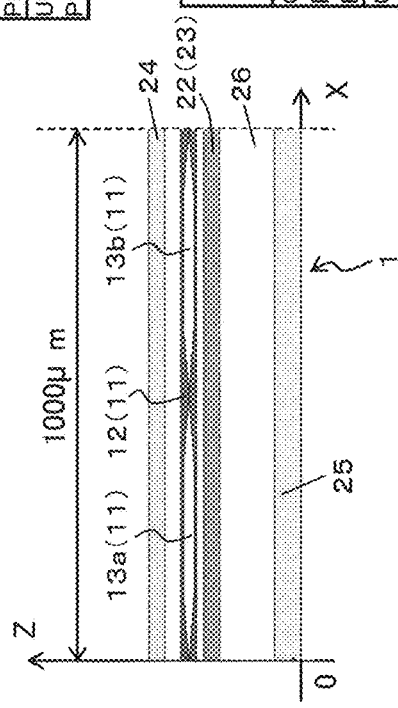

| | SHAPE | SIZE (WIDTH [μm] × HEIGHT [μm]) | CENTER COORDINATES (Y[μm], Z[μm]) |
|---|---|---|---|
| ONE HORIZONTAL GLASS FIBER BUNDLE 13a IN FIRST GLASS CLOTH | HEXAGONAL POLE | 500 × 20 | 250, 205 |
| OTHER HORIZONTAL GLASS FIBER BUNDLE 13b IN FIRST GLASS CLOTH | HEXAGONAL POLE | 500 × 20 | 750, 205 |

FIG. 11A

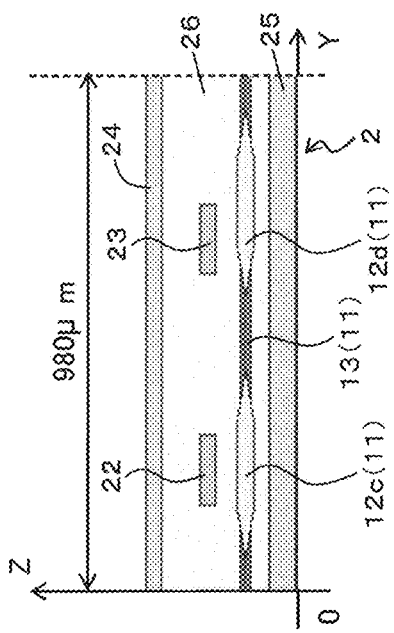

FIG. 11B

| | SHAPE | SIZE (WIDTH [μm] × HEIGHT [μm]) | CENTER COORDINATES (Y[μm], Z[μm]) |
|---|---|---|---|
| ONE DIFFERENTIAL INTERCONNECTION 22 | RECTANGULAR SOLID | 130 × 30 | 235, 163 |
| OTHER DIFFERENTIAL INTERCONNECTION 23 | RECTANGULAR SOLID | 130 × 30 | 665, 163 |
| ONE VERTICAL GLASS FIBER BUNDLE 12c IN SECOND GLASS CLOTH | HEXAGONAL POLE | 350 × 30 | 245, 95 |
| OTHER VERTICAL GLASS FIBER BUNDLE 12d IN SECOND GLASS CLOTH | HEXAGONAL POLE | 350 × 30 | 735, 95 |
| RESIN 26 | RECTANGULAR SOLID | 980 × 200 | 490, 150 |
| LOWER SIDE GROUND PLANE 25 | RECTANGULAR SOLID | 980 × 50 | 490, 25 |
| UPPER SIDE GROUND PLANE 24 | RECTANGULAR SOLID | 980 × 30 | 490, 265 |

FIG. 11C

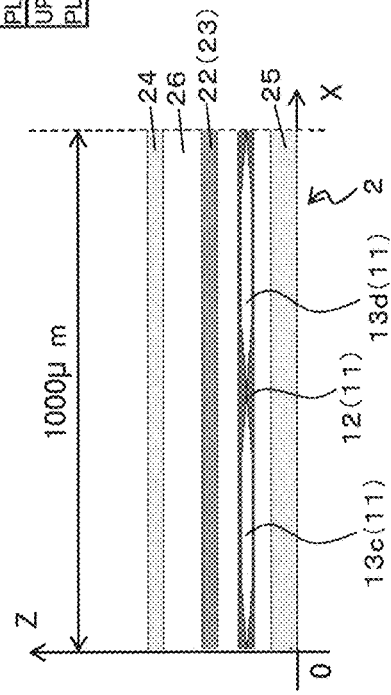

FIG. 11D

| | SHAPE | SIZE (WIDTH [μm] × HEIGHT [μm]) | CENTER COORDINATES (Y[μm], Z[μm]) |
|---|---|---|---|
| ONE HORIZONTAL GLASS FIBER BUNDLE 13c IN SECOND GLASS CLOTH | HEXAGONAL POLE | 500 × 20 | 250, 95 |
| OTHER HORIZONTAL GLASS FIBER BUNDLE 13d IN SECOND GLASS CLOTH | HEXAGONAL POLE | 500 × 20 | 750, 95 |

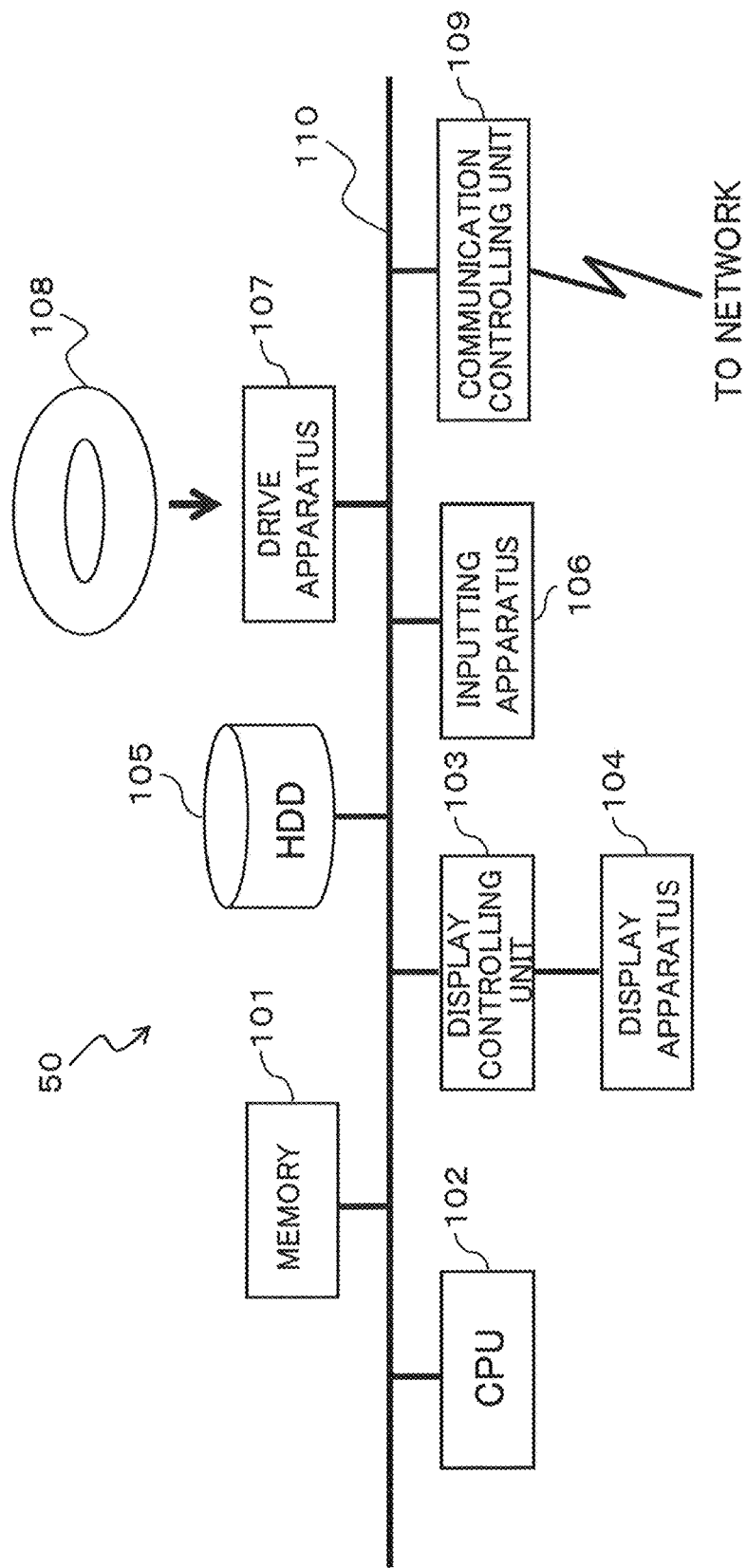

SIMULATION METHOD AND SIMULATION APPARATUS

CROSS-REFERENCE TO RELATED APPLICATION

This application is based upon and claims the benefit of priority of the prior Japanese Patent Application No. 2013-108199, filed on May 22, 2013, the entire contents of which are incorporated herein by reference.

FIELD

The embodiments discussed herein are related to a simulation method, a simulation apparatus and a computer-readable recording medium having stored therein a simulation program for causing a computer to execute a simulation process.

BACKGROUND

Together with increase of the speed of signal transmission in electronic equipment, differential transmission is generally used as a technology for compensating for degradation of the S/N ratio arising from increase of transmission loss. In the differential transmission, two lines including a P line and an N line are used as one set and transmit signals having phases opposite to each other therethrough. As a result, common noise having a substantially same phase appears on the two lines on the reception side. The common noise is cancelled by taking the difference between the signals. Consequently, the S/N ratio can be improved.

For example, in a wiring board including a glass cloth and differential lines, the dielectric constant of the glass cloth is generally higher than that of resin, and therefore, the propagation delay is small in a region in which the glass cloth is small in amount but is great in a region in which the glass cloth is great in amount. Therefore, a propagation delay time difference (skew) between the lines is generated and the cancellation rate of common noise drops. Together with increase of the speed of signal transmission in recent years, an influence of the skew on a transmission characteristic cannot be ignored.

Therefore, a transmission simulation that takes a skew into consideration is required in order to carry out transmission path design with high accuracy. For example, in order to predict a skew in a wiring board including a glass cloth and differential lines, the internal structure of the wiring board is modeled using a three-dimensional numerical analysis tool to perform electromagnetic analysis.

SUMMARY

According to an aspect of the embodiment, a simulation method, a simulation apparatus and a computer-readable recording medium having stored therein a simulation program for causing a computer to execute a simulation process include calculating, by performing a three-dimensional electromagnetic field analysis for each of a plurality of first positional patterns of a first wiring board internal structure model for a basic line length including one first glass cloth at the upper side of a pair of first differential lines, the plurality of first positional patterns having different relative positional relationships between the first differential lines and the first glass cloth, a first skew generated between the pair of first differential lines in each of the plurality of first positional patterns, and calculating, by performing a three-dimensional electromagnetic field analysis for each of a plurality of second positional patterns of a second wiring board internal structure model for a basic line length including one second glass cloth at the lower side of a pair of second differential lines, the plurality of second positional patterns having different relative positional relationships between the second differential lines and the second glass cloth, a second skew generated between the pair of second differential lines in each of the plurality of second positional patterns, and calculating, for each of a plurality of wiring board patterns configured by combining a plurality of first combination patterns individually configured by combining the plurality of first positional patterns of the first wiring board internal structure model for a certain line length and a plurality of second combination patterns individually configured by combining the plurality of second positional patterns of the second wiring board internal structure model for a certain line length, a total skew by summing the first skew of each of the plurality of first positional patterns configuring each of the plurality of first combination patterns and summing the second skew of each of the plurality of second positional patterns configuring each of the plurality of second combination patterns, and then acquiring a skew distribution in a wiring board having a certain line length based on the calculated total skews.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A and 2B are schematic views depicting a first wiring board internal structure model of a basic unit that includes one glass cloth at the upper side of a pair of differential lines and is modeled in the simulation apparatus according to the present embodiment, wherein FIG. 2A is a sectional view taken along a direction orthogonal to a direction in which the lines extend and FIG. 2B is a sectional view taken along a direction in which the lines extend;

FIGS. 3A and 3B are schematic views depicting a second wiring board internal structure model of a basic unit that includes one glass cloth at the lower side of a pair of differential lines and is modeled in the simulation apparatus according to the present embodiment, wherein FIG. 3A is a sectional view taken along a direction orthogonal to a direction in which the lines extend and FIG. 3B is a sectional view taken along the direction in which the lines extend;

FIGS. 4A and 4B are schematic views depicting the first wiring board internal structure of the basic unit including one glass cloth at the upper side of the pair of differential lines, wherein FIG. 4A is a sectional view taken along a direction orthogonal to the direction in which the lines extend and FIG. 4B is a sectional view taken along the direction in which the lines extend;

FIGS. 5A and 5B are schematic views depicting the second wiring board internal structure of the basic unit including one glass cloth at the lower side of the pair of differential lines, wherein FIG. 5A is a sectional view taken along a direction orthogonal to the direction in which the lines extend and FIG. 5B is a sectional view taken along the direction in which the lines extend;

FIGS. 6A to 6D are schematic views exemplifying cases in which the line positions in the first wiring board internal structure of the basic unit including one glass cloth at the upper side of the pair of differential lines differ and are sectional views taken along a direction orthogonal to a direction in which the lines extend;

FIGS. 7A to 7D are schematic views exemplifying a plurality of positional patterns in which the line positions in the first wiring board internal structure of the basic unit including one glass cloth at the upper side of the pair of differential lines in the simulation apparatus according to the present embodiment differ and are sectional views taken along a direction orthogonal to a direction in which the lines extend;

FIG. 9 is a flow chart depicting a process (simulation method) by the simulation apparatus according to the present embodiment;

FIGS. 10A to 10D are views depicting the first wiring board internal structure model modeled by the simulation apparatus according to the present embodiment and data that define the model;

FIGS. 11A to 11D are views depicting the second wiring board internal structure model modeled by the simulation apparatus according to the present embodiment and data that define the model;

FIG. 19 is a block diagram depicting an example of a hardware configuration of the simulation apparatus according to the present embodiment.

DESCRIPTION OF EMBODIMENTS

Incidentally, since a skew depends upon the positional relationship between a glass cloth and differential lines, it is considered that the skew has a certain distribution. Further, there is the possibility that the positional relationship between the differential lines and the glass cloth in the wiring board may have several patterns depending upon the inclination of the glass cloth with respect to the differential lines. Therefore, in order to predict a skew in a certain wiring board, it is necessary to acquire a skew distribution (skew statistical data) in the wiring board, and the accuracy of the prediction depends upon the number of analysis specimens.

However, since a three-dimensional numerical analysis tool directly meshes a target structure three-dimensionally, if the number of analysis specimens increases, then the calculation time and the calculation capacity increase enormously.

Therefore, it is an object to provide a simulation method, a simulation apparatus and a computer-readable recording medium having stored therein a simulation program for causing a computer to execute a simulation process that can suppress a calculation cost for electromagnetic field analysis by a three-dimensional numerical analysis tool and can acquire a skew distribution with high accuracy and at a high speed.

In the following, a simulation method, a simulation apparatus and a computer-readable recording medium having stored therein a simulation program for causing a computer to execute a simulation process according to the present embodiment are described with reference to the drawings.

The simulation apparatus according to the present embodiment is a simulation apparatus that simulates signal propagation in a wiring board, and particularly analyzes a propagation delay time difference (skew) appearing between differential lines of the wiring board for high-speed transmission for which a glass cloth is used.

Figure 14:
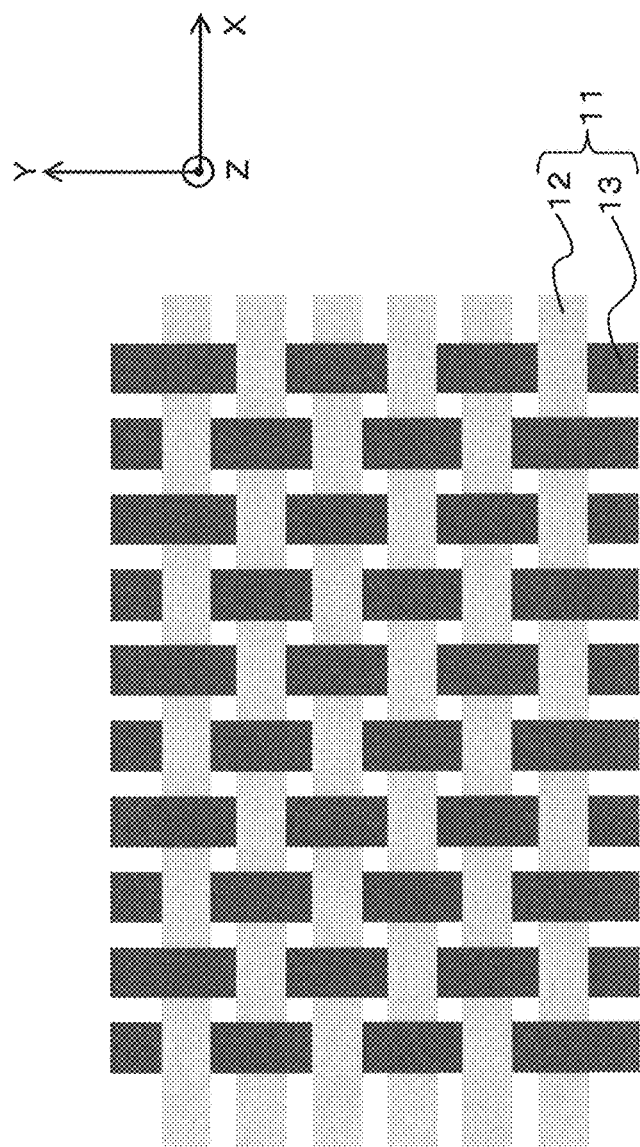
FIG. 14 is a schematic plan view of a glass cloth configuring a wiring board.

FIG. 14 is a schematic view of a glass cloth configuring the high-speed transmission wiring board.

As depicted in FIG. 14, a glass cloth 11 is configured by plane weaving glass fiber bundles 12 juxtaposed in a direction parallel to an X axis and glass fiber bundles 13 juxtaposed in a direction parallel to a Y direction in a lattice shape. Here, the glass fiber bundles 12 and 13 are individually configured by bundling a plurality of glass fibers individually having a thickness of, for example, approximately several µm so as to have a width of approximately several 100 µm as a whole.

Figure 15:
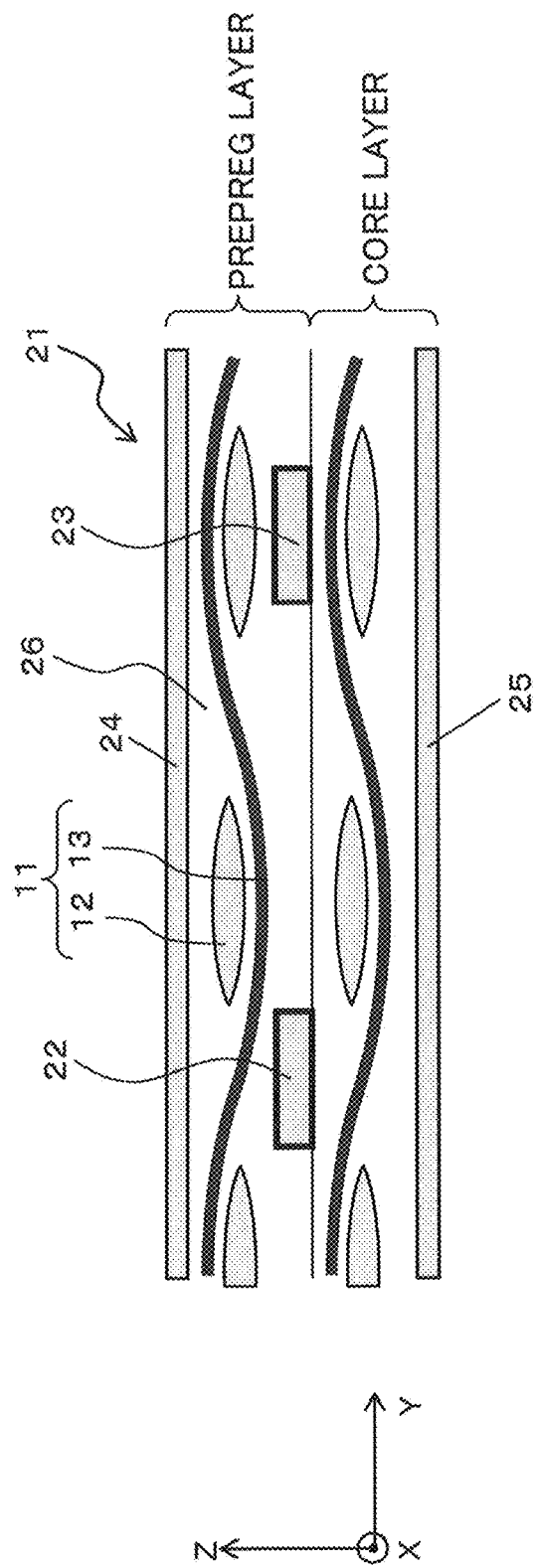
FIG. 15 is a schematic view of the wiring board in which the glass cloth is used and is a sectional view taken along a direction orthogonal to the direction in which the lines extend.

FIG. 15 is a sectional view perpendicular to an line direction in the high-speed transmission wiring board in which a glass cloth is used.

As depicted in FIG. 15, the high-speed transmission wiring board (hereinafter referred to as glass cloth wiring board) 21 in which a glass cloth is used is configured from a conductive layer and an insulating layer. The conductive layer is configured from a differential line 22 configured from a P line or an N line, another differential line 23 configured from an N line or a P line, and ground planes 24 and 25. Further, the insulating layer is configured from a glass cloth 11 and resin 26 for hardening the glass cloth 11. In this means, the glass cloth wiring board 21 includes a set of two differential lines (a pair of differential lines) 22 and 23, ground planes 24 and 25 of two layers and the two insulating layers sandwiched between the pair of differential lines 22 and 23 and the ground planes 24 and 25 and configured from the glass cloth 11 and the resin 26. It is to be noted that, as depicted in FIG. 15, the glass cloth wiring board 21 can be partitioned into a core layer and a prepreg layer (connecting layer).

It is to be noted here that, while the glass cloth wiring board 21 includes one glass cloth 11 at the upper side the pair of differential lines 22 and 23 and one glass cloth 11 at the lower side of the pair of differential lines 22 and 23, the glass cloth wiring board 21 is not limited to this. Only it is necessary for the glass cloth wiring board 21 to include at least one glass cloth 11 at the upper side of the pair of differential lines 22 and 23 and at least one glass cloth 11 at the lower side of the pair of differential lines 22 and 23.

As described hereinabove with reference to FIG. 14, the glass cloth 11 included in the insulating layer is structured such that the glass fiber bundles (warps) 12 and the glass fiber bundles (wefts) 13 individually formed from glass are woven. The structure includes crossing regions in which both of the glass fiber bundles 12 and 13 exist, regions in which none of the glass fiber bundles 12 and 13 exist, regions in which only the glass fiber bundles 12 exist and regions in which only the glass fiber bundles 13 exist.

Generally, in the glass cloth wiring board 21, the dielectric constant of the glass cloth 11 is higher than that of the resin 26. As depicted in FIG. 15, the inside of the glass cloth wiring board 21 is configured from regions in which the density of the glass cloth 11 having the high dielectric constant is high and regions in which the density of the resin 26 having the low dielectric constant is high, and therefore is structured such that the dielectric constant is not uniform. As a result, the dielectric constant differs around the differential lines 22 and 23. Consequently, the propagation delay is small in the regions in which the density of the glass cloth 11 is low but is great in the regions in which the density of the glass cloth 11 is high, and a propagation delay time difference (skew; clock skew) between the lines appears and the cancellation ratio of common noise decreases. Together with increase of the speed of signal transmission in recent years, the influence of the skew on a transmission characteristic cannot be ignored.

Therefore, in order to perform transmission path design with high accuracy, it is necessary to perform a transmission simulation taking a skew into consideration.

Figure 16:
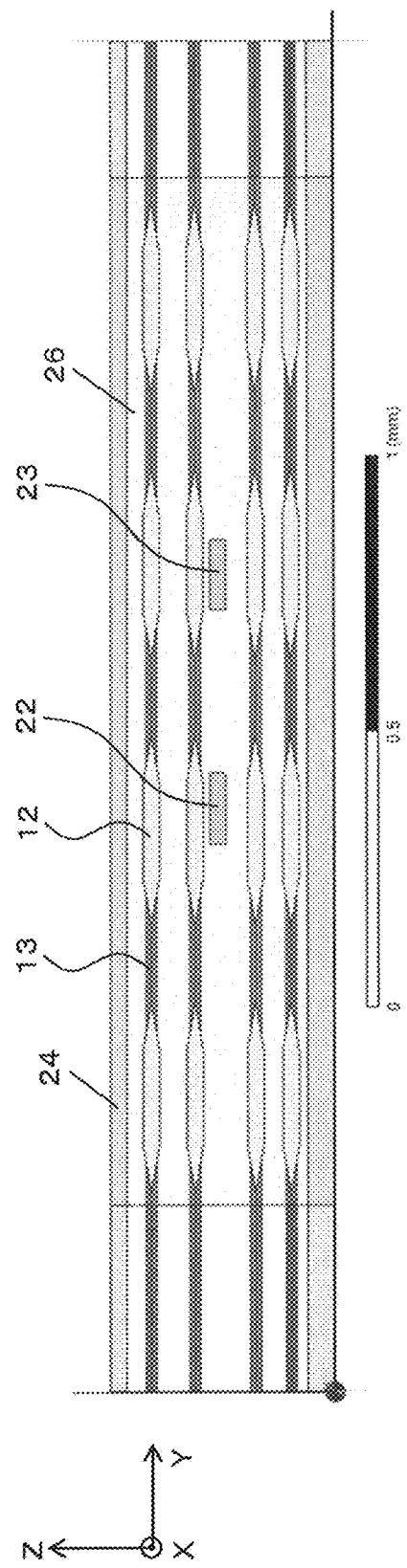
FIG. 16 is a schematic view depicting a three-dimensional electromagnetic analysis model obtained by modeling the wiring board in which the glass cloth is used and is a sectional view taken along a direction orthogonal to the direction in which the lines extend.
Figure 17:
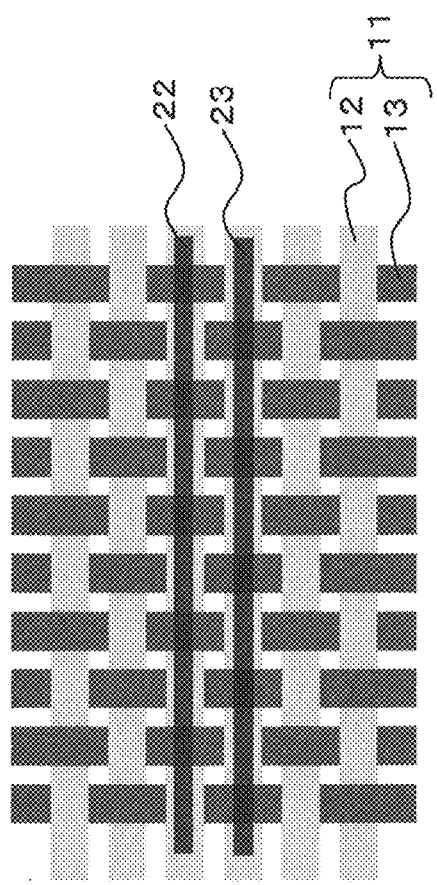
FIG. 17 is a schematic plan view depicting a wiring board in which a glass cloth that is not inclined with respect to the differential lines is used.
Figure 18:
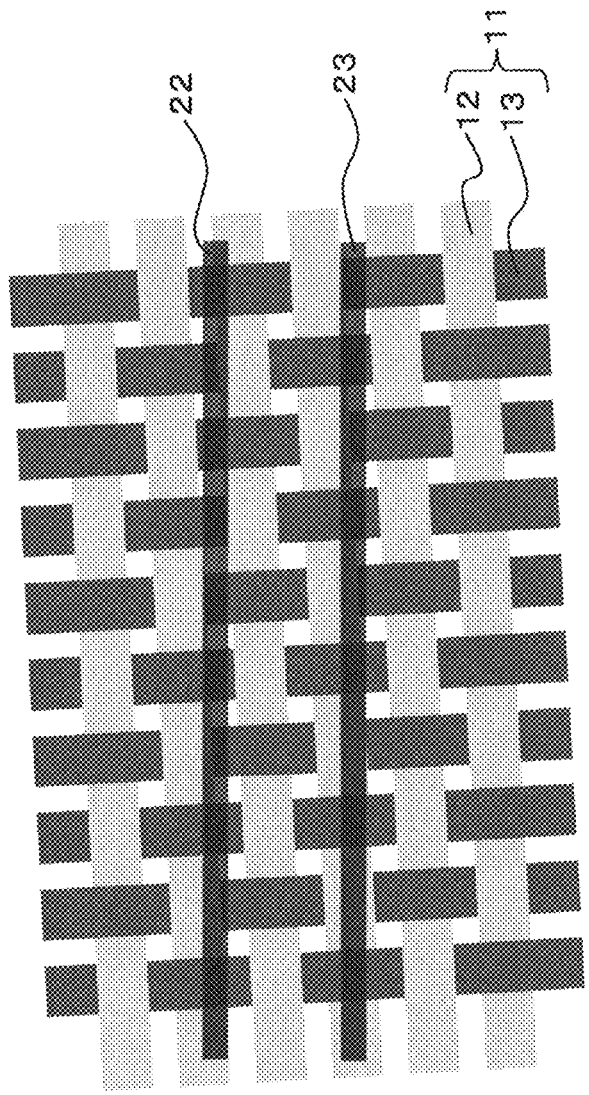
FIG. 18 is a schematic plan view depicting a wiring board in which a glass cloth inclined with respect to the differential lines is used.

FIG. 16 is a schematic sectional view depicting a three-dimensional electromagnetic analysis model obtained by modeling the glass cloth wiring board 21. FIG. 17 is a schematic plan view depicting a case in which the glass cross 11 is not inclined with respect to the differential lines 22 and 23 in the glass cloth wiring board 21. Further, FIG. 18 is a schematic plan view depicting a case in which the glass cross 11 is inclined with respect to the differential lines 22 and 23 in the glass cloth wiring board 21.

In order to predict a skew in the glass cloth wiring board 21, the internal structure of the glass cloth wiring board 21 is modeled using a three-dimensional numerical analysis tool as depicted in FIG. 16 to perform electromagnetic analysis.

It is considered that, since a skew depends upon a positional relationship between the texture of the glass cloth 11 and the differential lines 22 and 23, it has a certain distribution. Further, the positional relationship between the differential lines 22 and 23 and the glass cloth 11 in the glass cloth wiring board 21 exhibits several patterns depending upon the inclination of the glass cloth 11 with respect to the differential lines 22 and 23 as depicted in FIGS. 17 and 18. Therefore, in order to predict a skew in the glass cloth wiring board 21, it is necessary to acquire a skew distribution (skew statistical data) of the glass cloth wiring board 21, and the accuracy of the acquisition depends upon the number of analysis specimens.

However, since the three-dimensional numerical analysis tool directly meshes a target structure three-dimensionally, if the number of analysis specimens increases, then the calculation time and the calculation amount increase enormously.

Therefore, the simulation apparatus according to the present embodiment is configured in such a means as described below in order to suppress the calculation cost for electromagnetic analysis by the three-dimensional numerical analysis tool and acquire a skew distribution with high accuracy and at a high speed.

Figure 1:
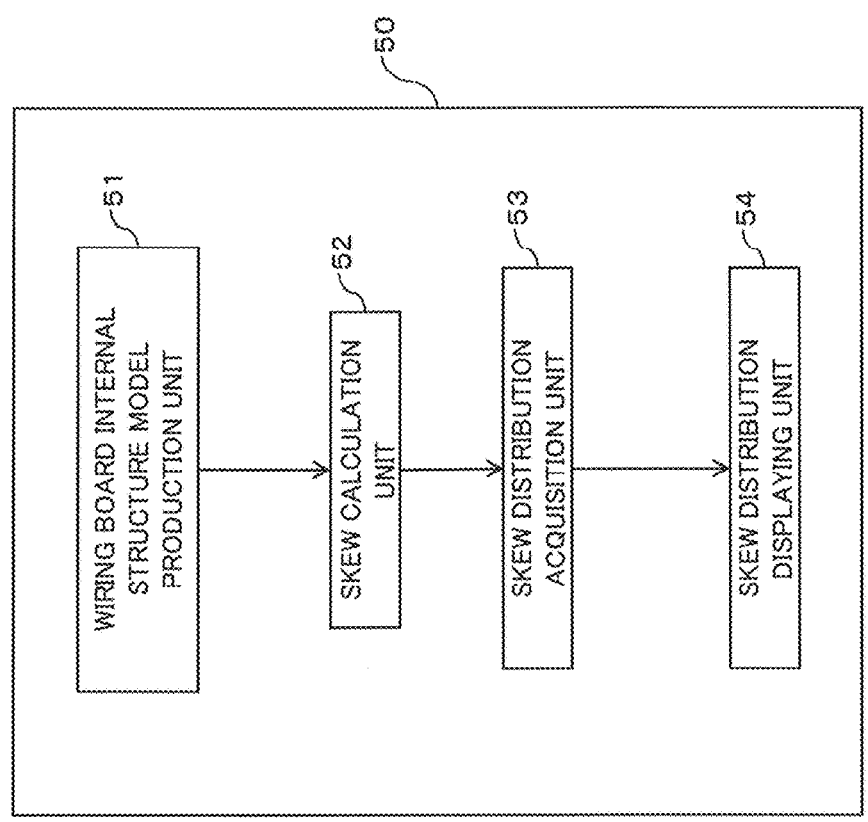
FIG. 1 is a functional block diagram of a simulation apparatus according to a present embodiment.

FIG. 1 is a functional block diagram of the present simulation apparatus.

As depicted in FIG. 1, the present simulation apparatus 50 includes a wiring board internal structure model production unit 51, a skew calculation unit 52, a skew distribution acquisition unit (skew statistical value acquisition unit) 53 and a skew distribution displaying unit (skew statistical value displaying unit) 54.

As depicted in FIG. 2A, the wiring board internal structure model production unit 51 produces a first wiring board internal structure model for a basic line length including one glass cloth (first glass cloth) 11 at the upper side of the pair of the differential lines (first differential lines) 22 and 23 and a second wiring board internal structure model for a basic line length including one glass cloth (second glass cloth) 11 at the lower side of the pair of the differential lines (second differential lines) 22 and 23. It is to be noted that the glass cloth 11 is referred to sometimes as lattice structure.

Figure 3A:
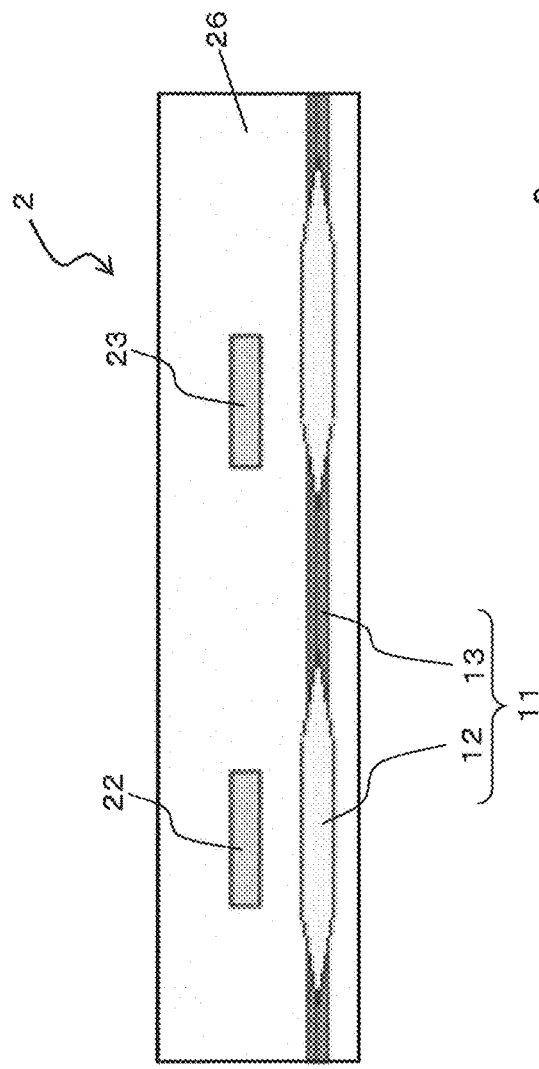
Figure 3B:
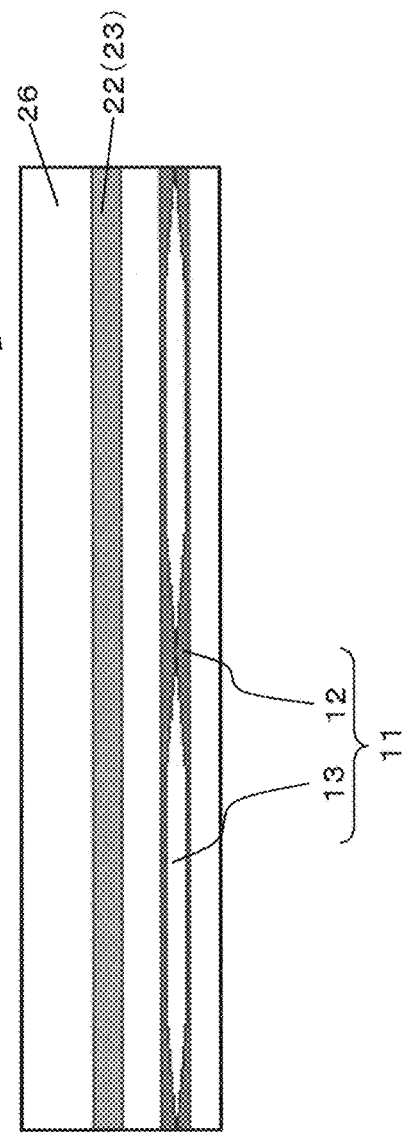

Here, as depicted in FIG. 2B, the first wiring board internal structure model 1 for the basic line length has a length corresponding to one cycle of the glass fiber bundles (vertical glass fiber bundles; warps; cloth bundles) 12 configuring the glass cloth 11 in a direction in which the pair of the differential lines 22 and 23 extend. Further, as depicted in FIG. 3B, the second wiring board internal structure model 2 for the basic line length has a length corresponding to one cycle of the glass fiber bundles (vertical glass fiber bundles; warps; cloth bundles) 12 configuring the glass cloth 11 in the direction in which the pair of the differential lines 22 and 23 extend. In this case, the basic line length is equal to that corresponding to one cycle of the vertical glass fiber bundles 12. Further, as depicted in FIG. 2A, the first wiring board internal structure model 1 has a length corresponding to one cycle of the glass fiber bundles (horizontal glass fiber bundles; wefts; cloth bundles) 13 configuring the glass cloth 11 in a direction orthogonal to the direction in which the pair of the differential lines 22 and 23 extend. Further, as depicted in FIG. 3A, the second wiring board internal structure model 2 has a length corresponding to one cycle of the glass fiber bundles (horizontal glass fiber bundles; wefts; cloth bundles) 13 configuring the glass cloth 11 in a direction orthogonal to the direction in which the pair of the differential lines 22 and 23 extend.

Figure 4A:
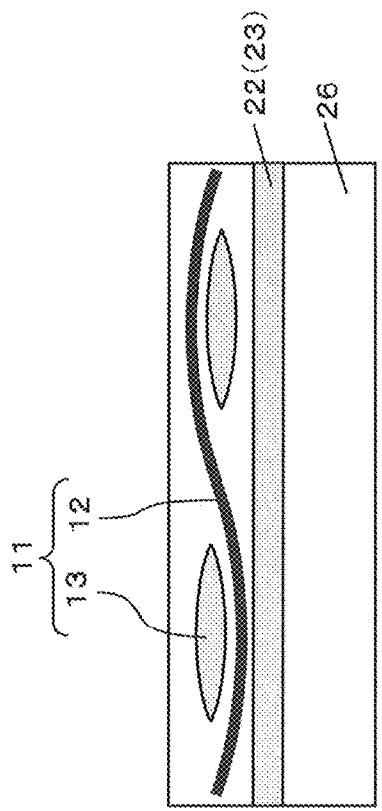
Figure 4B:
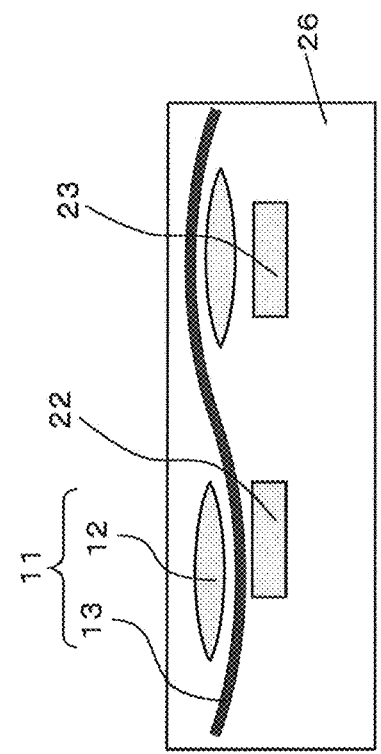

In this means, such an internal structure of part of the glass cloth wiring board 21 including one glass cloth 11 at the upper side of the pair of the differential lines 22 and 23 as depicted in FIGS. 4A and 4B is modeled (modeled in three-dimensional electromagnetic field analysis) using a three-dimensional numerical analysis tool taking the lengths in the vertical and horizontal directions as the lengths of the glass fiber bundles 12 and 13 of the glass cloth 11 corresponding to one cycle to produce such a first wiring board internal structure model 1 as depicted in FIGS. 2A and 2B. In this case, a rectangular region including one glass cloth 11 at the upper side of the pair of the differential lines 22 and 23 and having the length of the glass fiber bundles 12 and 13 corresponding to one cycle in the vertical and horizontal directions is used as a basic unit for modeling. Further, such an internal structure of part of the glass cloth wiring board 21 including one glass cloth 11 at the lower side of the pair of the differential lines 22 and 23 as depicted in FIGS. 5A and 5B is modeled using the three-dimensional numerical analysis tool taking the lengths in the vertical and horizontal directions as the lengths of the glass fiber bundles 12 and 13 of the glass cloth 11 corresponding to one cycle to produce such a second wiring board internal structure model 2 as depicted in FIGS. 3A and 3B. In this case, a rectangular region including one glass cloth 11 at the lower side of the pair of the differential lines 22 and 23 and having the length of the glass fiber bundles 12 and 13 corresponding to one cycle in the vertical and horizontal directions is used as a basic unit for modeling. It is to be noted that the glass cloth 11 included in the first and second wiring board internal structure models 1 and 2 is referred to sometimes as lattice structure.

Here, the first and second wiring board internal structure models 1 and 2 are produced assuming that the pair of the differential lines 22 and 23 provided in parallel to each other are provided in parallel to the vertical glass fiber bundles 12 extending in the vertical direction or the horizontal glass fiber bundles 13 extending in the horizontal direction which configure the glass cloth 11. In particular, the first and second wiring board internal structure models 1 and 2 here are produced assuming that the plurality of vertical glass fiber bundles 12 and the plurality of horizontal glass fiber bundles 13 are juxtaposed cyclically and in parallel to each other, and the vertical glass fiber bundles 12 extend in parallel to the pair of the differential lines 22 and 23 and the horizontal glass fiber bundles 13 extend orthogonally to the pair of differential lines 22 and 23. It is to be noted here that the glass cloth 11 included in the first wiring board internal structure model 1 and the glass cloth 11 included in the second wiring board internal structure model 2 have the same structure. Further, the pair of the differential lines 22 and 23 included in the first wiring board internal structure model 1 and the pair of the differential lines 22 and 23 included in the second wiring board internal structure model 2 have the same structure.

It is to be noted here that, while the first and second wiring board internal structure models 1 and 2 have the length of the glass fiber bundles 12 and 13 of the glass cloth 11 corresponding to one cycle in the vertical and horizontal directions, the models are not limited to them, and the models may be set so as to have at least a length corresponding to one cycle and may be set so as to have, for example, a length corresponding to a plurality of cycles. In other words, the first wiring board internal structure model 1 for the basic line length may be set so as to have a length of the glass fiber bundles configuring the first glass cloth corresponding to a plurality of cycles in a direction in which the first differential lines extend. Further, the second wiring board internal structure model for the basic line length may be set so as to have a length of the glass fiber bundles configuring the second glass cloth corresponding to a plurality of cycles in a direction in which the second differential lines extend. In those cases, the lengths of the first and second wiring board internal structure models in the lines transmission direction are equal to an integral multiple of the length corresponding to one cycle of the glass fiber bundles configuring the glass cloth and extending in the lines transmission direction. Further, the first wiring board internal structure model may be set so as to have a length of the glass fiber bundles configuring the first glass cloth corresponding to a plurality of cycles in a direction orthogonal to the direction in which the first differential lines extends. Further, the second wiring board internal structure model may be set so as to have a length of the glass fiber bundles configuring the second glass cloth corresponding to a plurality of cycles in a direction orthogonal to the direction in which the second differential lines extends. In those cases, the lengths of the first and second wiring board internal structure models of the direction orthogonal to the lines transmission direction are equal to an integral multiple of the length corresponding to one cycle of the glass fiber bundles configuring the glass cloth and extending in the direction orthogonal to the lines transmission direction. It is to be noted that, where the length in the vertical and horizontal directions of the first and second wiring board internal structure models is represented by a number of cycles of the glass fiber bundles of the glass cloth, the number of cycles may be determined depending upon whether or not a pair of differential lines are included in a basic unit of modeling. For example, where the first and second wiring board internal structure models are set so as to have a length of the glass fiber bundles of the glass cloth corresponding to one cycle in the vertical and horizontal directions in order to calculate a skew of a wiring board, when the pair of the differential lines do not fit in but protrude from the basic unit of the modeling, the first and second wiring board internal structure models may be set so as to have a length corresponding to two cycles of the glass fiber bundles of the glass cloth in the vertical and horizontal directions.

The skew calculation unit 52 performs three-dimensional electromagnetic analysis for a plurality of positional patterns 1X (first positional patterns; refer to FIG. 8) among which the relative positional relationship between the pair of the differential lines 22 and 23 and the glass cloth 11 of the first wiring board internal structure model 1 produced by the wiring board internal structure model production unit 51 differs, and calculates a skew (first skew) appearing between the pair of the differential lines 22 and 23 in each of the plurality of positional patterns 1X. For example, the skew may be calculated in the following means using a three-dimensional numerical analysis tool. In particular, as depicted in FIGS. 7A to 7D, for example, four positional patterns 1A to 1D are produced as the plurality of positional patterns 1X in which the center line of the pair of the differential lines 22 and 23 is displaced in a horizontal direction (or a thickness direction) with respect to a center line of the lattice pattern of the glass cloth 11 (lattice structure) of the first wiring board internal structure model 1 such that the relative positional relationship between the pair of the differential lines 22 and 23 and the glass cloth 11 of the first wiring board internal structure model 1 differs among the plurality of positional patterns 1X. Then, the three-dimensional electromagnetic analysis is performed for each of the four positional patterns 1A to 1D to calculate the skew. It is to be noted that, as the plurality of positional patterns 1X, at least two positional patterns may be produced. Further, an example of a determination method for a positional relationship is hereinafter described with reference to FIGS. 6A to 6D and 7A to 7D.

Similarly, the skew calculation unit 52 carries out three-dimensional electromagnetic analysis for a plurality of positional patterns 2X (second positional patterns; refer to FIG. 8) among which the relative positional relationship between the pair of the differential lines 22 and 23 and the glass cloth 11 of the second wiring board internal structure model 2 produced by the wiring board internal structure model production unit 51 differs, and calculates a skew (second skew) appearing between the pair of the differential lines 22 and 23 in each of the plurality of positional patterns 2X. For example, the skew may be calculated similarly as in the case [refer to FIGS. 7A to 7D] in the first wiring board internal structure model 1. In particular, for example, four positional patterns are produced as the plurality of positional patterns 2X in which the center line of the pair of the differential lines 22 and 23 is displaced in a horizontal direction (or a thickness direction) with respect to the center line of the lattice pattern of the glass cloth 11 (lattice structure) of the second wiring board internal structure model 2 such that the relative positional relationship between the pair of the differential lines of the second wiring board internal structure model 2 and the glass cloth 11 differs among the plurality of positional patterns 2X. Then, the three-dimensional electromagnetic analysis is performed for each of the four positional patterns to calculate the skew. It is to be noted that, as the plurality of positional patterns, at least two positional patterns may be produced.

It is to be noted that, while, in the present simulation apparatus 50, the first and second wiring board internal structure models 1 and 2 are produced by the wiring board internal structure model production unit 51 and a plurality of positional patterns are produced relating to each of the first and second wiring board internal structure models 1 and 2 by the skew calculation unit 52 and then the three-dimensional electromagnetic analysis is performed for each of the plurality of positional patterns to calculate skew, the simulation apparatus is not limited to this. For example, the simulation apparatus may include a skew calculation unit that performs the three-dimensional electromagnetic analysis for each of the plurality of first positional patterns among which the relative positional relationship between the first differential lines and the first glass cloth of the first wiring board internal structure model for the basic line length including one first glass cloth at the upper side of the pair of the first differential lines differs to calculate the first skew appearing between the pair of the first differential lines in each of the plurality of first positional patterns, and performs the three-dimensional electromagnetic analysis for each of the plurality of second positional patterns among which the relative positional relationship between the second differential lines and the second glass cloth of the second wiring board internal structure model for the basic line length including one second glass cloth at the lower side of the pair of the second differential lines differs to calculate the second skew appearing between the pair of the second differential lines in each of the plurality of second positional patterns. It is to be noted that, while, in the present simulation apparatus 50, the plurality of positional patterns are produced individually relating to the first and second wiring board internal structure models 1 and 2 by the skew calculation unit 52, this may be considered that the plurality of first wiring board internal structure models among which the relative positional relationship between the first differential lines and the first glass cloth differs and the plurality of second wiring board internal structure models among which the relative positional relationship between the second differential lines and the second glass cloth differs are produced. In short, the skew may be calculated in the following means. In particular, the wiring board internal structure model production unit produces the plurality of first wiring board internal structure models among which the relative positional relationship between the first differential lines and the first glass cloth differs as the plurality of first positional patterns of the first wiring board internal structure model. The wiring board internal structure model production unit further produces the plurality of second wiring board internal structure models among which the relative positional relationship between the second differential lines and the second glass cloth differs as the plurality of second positional patterns of the second wiring board internal structure model. Then, the skew calculation unit performs the three-dimensional electromagnetic analysis for each of the plurality of first wiring board internal structure models and the plurality of second wiring board internal structure models to calculate the skews.

Figure 8:
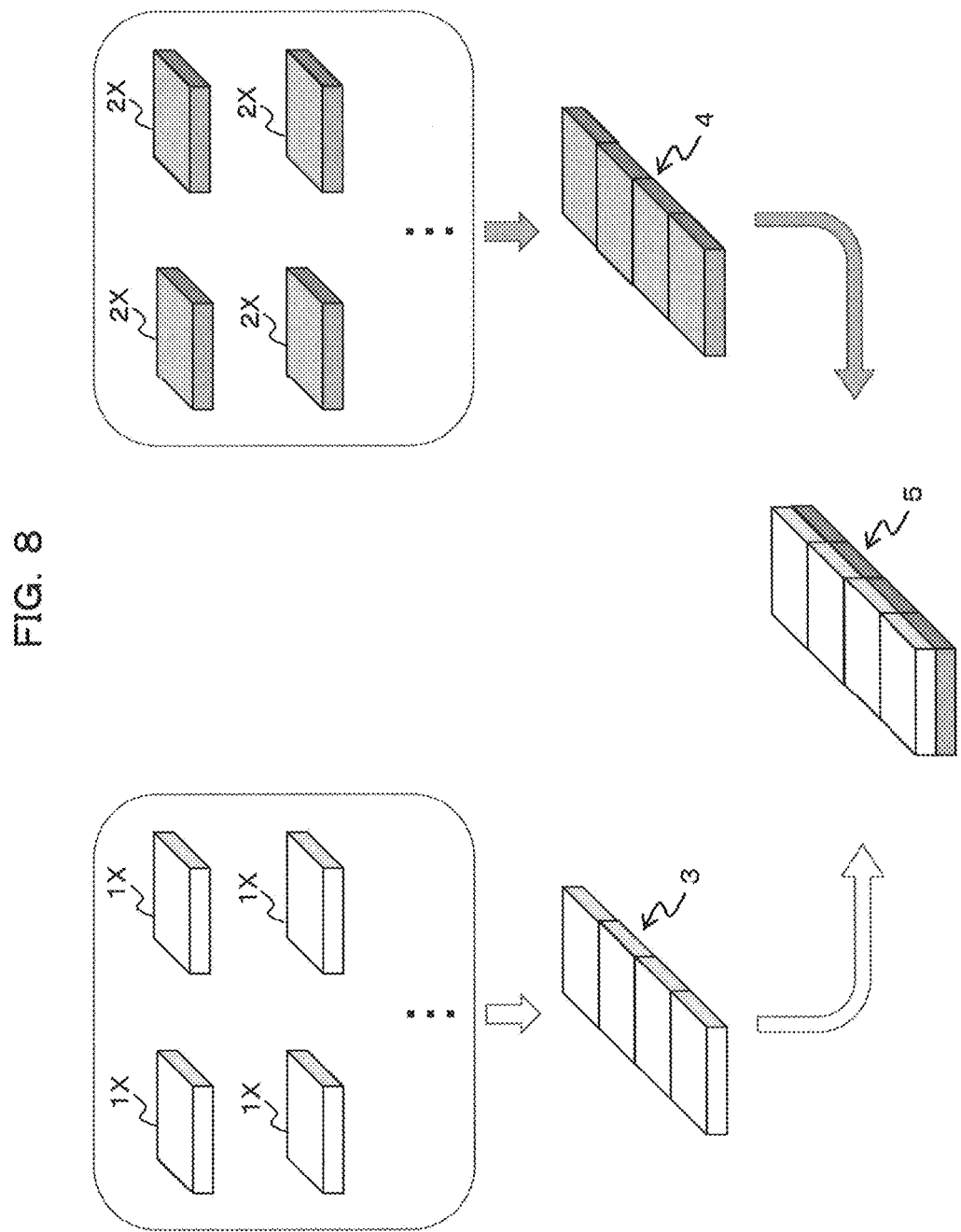
FIG. 8 is a schematic view illustrating a function and a process of a skew distribution acquisition unit provided in the simulation apparatus according to the present embodiment.

As depicted in FIG. 8, the skew distribution acquisition unit 53, for each of a plurality of wiring board patterns 5 configured by combining a plurality of first combination patterns individually configured by combining a plurality of first combination patterns 3 configured by combining the plurality of first positional patterns 1X of the first wiring board internal structure model 1 for a certain line length and a plurality of second combination patterns 4 configured by combining the plurality of second positional patterns 2X of the second wiring board internal structure model 2 for a certain line length, sums the first skews of each of the plurality of first positional patterns 1X configuring each of the plurality of first combination patterns 3, sums the second skews of each of the plurality second positional patterns 2X configuring each of the plurality of second combination patterns 4, and calculates a total skew by adding the sum of the first skews to the sum of the second skews, and then acquires a skew distribution in the wiring board having a certain line length based on the calculated total skews.

Here, the skew distribution acquisition unit 53 extracts and combines some first positional patterns 1X for the certain line length arbitrarily from among the plurality of first positional patterns 1X of the first wiring board internal structure model 1 to produce the plurality of first combination patterns 3, and sums the first skews of each of the plurality of first positional patterns 1X configuring each of the plurality of first combination patterns 3 to calculate a total skew for each of the plurality of first combination patterns 3. Further, the skew distribution acquisition unit 53 extracts and combines some second positional patterns 2X for the certain line length arbitrarily from among the plurality of second positional patterns 2X of the second wiring board internal structure model 2 to produce the plurality of second combination patterns 4, and sums the second skews of each of the plurality of second positional patterns 2X configuring each of the plurality of second combination patterns 4 to calculate a total skew for each of the plurality of second combination patterns 4. Further, the skew distribution acquisition unit 53 extracts and combines arbitrary ones of the plurality of first combination patterns 3 and the plurality of second combination patterns 4 one by one with each other to produce a plurality of wiring board patterns 5, and sums the total skews of the first combination patterns 3 and the total skews of the second combination patterns 4 configuring each of the plurality of wiring board patterns 5 to calculate a total skew for each of the plurality of wiring board patterns 5. Then, the skew distribution acquisition unit 53 acquires a skew distribution in the wiring board having the certain line length based on the total skews of the plurality of wiring board patterns 5 calculated in such a means as described above. Here, the total skew of each of the plurality of wiring board patterns 5 is counted for each of values of the skews, and the skew value and the number of counts are taken as an axis of abscissa and an axis of ordinate, respectively, such that the skew distribution (skew statistics value) is acquired.

The skew distribution display unit 54 causes the skew distribution acquired by the skew distribution acquisition unit 53 to be displayed on a screen.

Now, a process (simulation method) by the simulation apparatus 50 according to the present embodiment is described with reference to FIG. 9.

FIG. 9 is a flow chart illustrating a flow of processes by the simulation method according to the present embodiment.

First at step S10, the wiring board internal structure model production unit 51 produces a first wiring board internal structure model 1 for a basic line length including one glass cloth (first glass cloth) 11 at the upper side of a pair of differential lines (first differential lines) 22 and 23 and a second wiring board internal structure model 2 for a basic line length including one glass cloth (second glass cloth) 11 at the lower side of a pair of differential lines (second differential lines) 22 and 23.

Here, such an internal structure of part of a glass cloth wiring board 21 including the one glass cloth 11 at the upper side of the pair of differential lines 22 and 23 as depicted in FIGS. 4A and 4B is modeled (modeled by the three-dimensional electromagnetic analysis) using a three-dimensional numerical analysis tool taking the lengths in the vertical and horizontal directions as the length of the glass fiber bundles 12 and 13 of the glass cloth 11 corresponding to one cycle to produce such a first wiring board internal structure model 1 as depicted in FIGS. 2A and 2B. Further, such an internal structure of part of the glass cloth wiring board 21 including the one glass cloth 11 at the lower side of the pair of differential lines 22 and 23 as depicted in FIGS. 5A and 5B is modeled using the three-dimensional numerical analysis tool taking the lengths in the vertical and horizontal directions as the length of the glass fiber bundles 12 and 13 of the glass cloth 11 corresponding to one cycle to produce such a second wiring board internal structure model 2 as depicted in FIGS. 3A and 3B. It is to be noted that, since details of the processes are described in the description of the function of the wiring board internal structure model production unit 51, description of details of the processes is omitted here.

FIGS. 10A to 10D are views depicting the first wiring board internal structure model 1 modeled in such a means as described above and data that define the model 1, namely, data that define the positional relationship between the glass fiber bundles 12 and 13 configuring the first glass cloth 11 and the pair of the differential lines 22 and 23.

Such a first wiring board internal structure model 1 produced by the wiring board internal structure model production unit 51 as depicted in FIGS. 10A and 10C is defined as such data as depicted in FIGS. 10B and 10D. For example, in the first wiring board internal structure model 1, relating to the differential lines 22, "shape", "size" and "center coordinates" are defined as "rectangular solid", "width 130 µm×height 30 µm" and "(235, 163)" as depicted in FIG. 10B, respectively. Further, relating to the differential lines 23, "shape", "size" and "center coordinates" are defined as "rectangular solid", "width 130 µm×height 30 µm" and "(665, 163)", respectively. Further, relating to the one vertical glass fiber bundle 12a configuring the first glass cloth 11, "shape", "size" and "center coordinates" are defined as "hexagonal pole", "width 350 µm×height 30 µm" and "(245, 205)", respectively. Further, relating to the other vertical glass fiber bundle 12b configuring the first glass cloth 11, "shape", "size" and "center coordinates" are defined as "hexagonal pole", "width 350 µm×height 30 µm" and "(735, 205)", respectively. Further, relating to the resin 26, "shape", "size" and "center coordinates" are defined as "rectangular solid", "width 980 µm×height 200 µm" and "(490, 150)", respectively. Further, relating to the ground plane 25 at the lower side, "shape", "size" and "center coordinates" are defined as "rectangular solid", "width 980 µm×height 50 µm" and "(490, 25)", respectively. Further, relating to the ground plane 24 at the upper side, "shape", "size" and "center coordinates" are defined as "rectangular solid", "width 980 µm×height 30 µm" and "(490, 265)", respectively. It is to be noted that the depth (size in the X direction) of all of the differential lines 22, differential lines 23, one and the other vertical glass fiber bundles 12a and 12b, resin 26 and ground planes 24 and 25 at the upper and lower sides is defined as 1,000 µm. Further, relating to the one horizontal glass fiber bundles 13a configuring the first glass cloth 11, "shape", "size" and "center coordinates" are defined as "hexagonal pole", "width 500 µm×height 20 µm" and "(250, 205)" as depicted in FIG. 10D, respectively. Further, relating to the other horizontal glass fiber bundles 13b configuring the first glass cloth 11, "shape", "size" and "center coordinates" are defined as "hexagonal pole", "width 500 µm×height 20 µm" and "(750, 205)", respectively. It is to be noted that the depth (size in the Y direction) of all of the one and the other horizontal glass fiber bundles 13a and 13b is defined as 980 µm. It is to be noted that, in the first wiring board internal structure model 1, it is defined that the vertical glass fiber bundles 12a and 12b (12) and the horizontal glass fiber bundles 13 (13a and 13b) are juxtaposed on the same plane.

FIGS. 11A to 11D are views depicting the second wiring board internal structure model 2 modeled in such a means as described above and data that define the model 2, namely, data that define the positional relationship between the glass fiber bundles 12 and 13 configuring the second glass cloth 11 and the pair of the differential lines 22 and 23.

Such a second wiring board internal structure model 2 produced by the wiring board internal structure model production unit 51 as depicted in FIGS. 11A and 11C is defined as such data as depicted in FIGS. 11B and 11D. For example, in the second wiring board internal structure model 2, relating to the differential lines 22, "shape", "size" and "center coordinates" are defined as "rectangular solid", "width 130 µm×height 30 µm" and "(235, 163)" as depicted in FIGS. 11B and 11D, respectively. Further, relating to the differential lines 23, "shape", "size" and "center coordinates" are defined as "rectangular solid", "width 130 µm×height 30 µm" and "(665, 163)", respectively. Further, relating to the one vertical glass fiber bundle 12c configuring the second glass cloth 11, "shape", "size" and "center coordinates" are defined as "hexagonal pole", "width 350 µm×height 30 µm" and "(245, 95)", respectively. Further, relating to the other vertical glass fiber bundle 12d configuring the second glass cloth 11, "shape", "size" and "center coordinates" are defined as "hexagonal pole", "width 350 µm×height 30 µm" and "(735, 95)", respectively. Further, relating to the resin 26, "shape", "size" and "center coordinates" are defined as "rectangular solid", "width 980 µm×height 200 µm" and "(490, 150)", respectively. Further, relating to the ground plane 25 at the lower side, "shape", "size" and "center coordinates" are defined as "rectangular solid", "width 980 µm×height 50 µm" and "(490, 25)", respectively. Further, relating to the ground plane 24 at the upper side, "shape", "size" and "center coordinates" are defined as "rectangular solid", "width 980 µm×height 30 µm" and "(490, 265)", respectively. It is to be noted that the depth (size in an X direction) of all of the differential lines 22, differential lines 23, one and the other vertical glass fiber bundles 12c and 12d, resin 26 and ground planes 24 and 25 at the upper and lower sides is defined as 1,000 µm. Further, relating to the one horizontal glass fiber bundle 13c configuring the second glass cloth 11, "shape", "size" and "center coordinates" are defined as "hexagonal pole", "width 500 µm×height 20 µm" and "(250, 95)" as depicted in FIG. 10D, respectively. Further, relating to the other horizontal glass fiber bundles 13d configuring the second glass cloth 11, "shape", "size" and "center coordinates" are defined as "hexagonal pole", "width 500 µm×height 20 µm" and "(750, 95)", respectively. It is to be noted that the depth (size in a Y direction) of all of the one and the other horizontal glass fiber bundles 13c and 13d is defined as 980 µm. It is to be noted that, in the second wiring board internal structure model 2, it is defined that the vertical glass fiber bundles 12c and 12d (12) and the horizontal glass fiber bundles 13 (13c and 13d) are juxtaposed on the same plane.

Then at step S20, the skew calculation unit 52 performs a three-dimensional electromagnetic analysis for each of the plurality of positional patterns 1X (first positional patterns; refer to FIG. 8) among which the relative positional relationship between the pair of the differential lines 22 and 23 and the glass cloth 11 of the first wiring board internal structure model 1 produced in such a means as described hereinabove differs to calculate a skew (first skew) appearing between the pair of the differential lines 22 and 23 in each of the plurality of positional patterns 1X. For example, the skew may be calculated in the following means using the three-dimensional numerical analysis tool. In particular, as depicted in FIGS. 7A to 7D, the skew calculation unit 52 produces, for example, four positional patterns 1A to 1D as the plurality of positional patterns 1X in which the center line of the pair of the differential lines 22 and 23 is displaced in a horizontal direction (or a thickness direction) with respect to a center line of the lattice pattern of the glass cloth 11 (lattice structure) of the first wiring board internal structure model 1 such that the relative positional relationship between the pair of the differential lines 22 and 23 and the glass cloth 11 of the first wiring board internal structure model 1 differs among the plurality of positional patterns 1X. Then, the skew calculation unit 52 performs the three-dimensional electromagnetic analysis for each of the four positional patterns 1A to 1D to calculate the skew.

Similarly, the skew calculation unit 52 performs a three-dimensional electromagnetic analysis for each of the plurality of positional patterns 2X (second positional patterns; refer to FIG. 8) among which the relative positional relationship between the pair of the differential lines 22 and 23 and the glass cloth 11 of the second wiring board internal structure model 2 produced in such a means as described hereinabove differs to calculate a skew (second skew) appearing between the pair of the differential lines 22 and 23 in each of the plurality of positional patterns 2X. For example, the skew may be calculated in the following means using the three-dimensional numerical analysis tool similarly as in the case of the first wiring board internal structure model 1 [refer to FIGS. 7A to 7D]. In particular, for example, the skew calculation unit 52 produces four positional patterns as the plurality of positional patterns 2X in which the center line of the pair of the differential lines 22 and 23 is displaced in a horizontal direction (or a thickness direction) with respect to the center line of the lattice pattern of the glass cloth 11 (lattice structure) of the second wiring board internal structure model 2 such that the relative positional relationship between the pair of the differential lines and the glass cloth 11 of the second wiring board internal structure model 2 differs among the plurality of positional patterns 2X. Then, the skew calculation unit 52 performs the three-dimensional electromagnetic analysis for each of the four positional patterns to calculate the skew.

The present embodiment is described below taking, as an example, a case in which the line position is changed in the first wiring board internal structure model 1 to produce the four positional patterns 1A to 1D and the three-dimensional electromagnetic analysis is performed.

FIGS. 6A to 6D are schematic sectional views exemplifying a case in which the line position in the first wiring board internal structure of the basic unit including one glass cloth at the upper side of the pair of the differential lines is changed to four different patterns. Meanwhile, FIGS. 7A to 7D are schematic sectional views exemplifying the four positional patterns 1A to 1D among which the line position in the first wiring board internal structure model 1 of the basic unit including one glass cloth at the upper side of the pair of the differential lines differs.

As exemplified in FIGS. 6A and 6D, the position of the pair of the differential lines 22 and 23 is changed to four different patterns. In particular, the first wiring board internal structure model 1 produced in such a means as described hereinabove is determined as the basic positional pattern 1A as depicted in FIG. 7A. Further, the positional pattern 1B in which the pair of the differential lines 22 and 23 included in the first wiring board internal structure model 1 are displaced by −100 μm in the Y direction as depicted in FIG. 7B, the positional pattern 1C in which the pair of the differential lines 22 and 23 are displaced by +100 μm in the Y direction as depicted in FIG. 7C and the positional pattern 1D in which the pair of the differential lines 22 and 23 are displaced by +200 μm in the Y direction as depicted in FIG. 7D are produced.

Then, a three-dimensional electromagnetic analysis is executed for each of the four positional patterns 1A to 1D produced in such a means as described above to calculate a skew between the differential lines 22 and the differential lines 23 in each of the positional patterns 1A to 1D. It is to be noted that, since the first wiring board internal structure model 1 has the length of the vertical glass fiber bundles corresponding to one cycle, the calculation of the skew here is performed for one cycle of the vertical glass fiber bundles.

Figure 12:
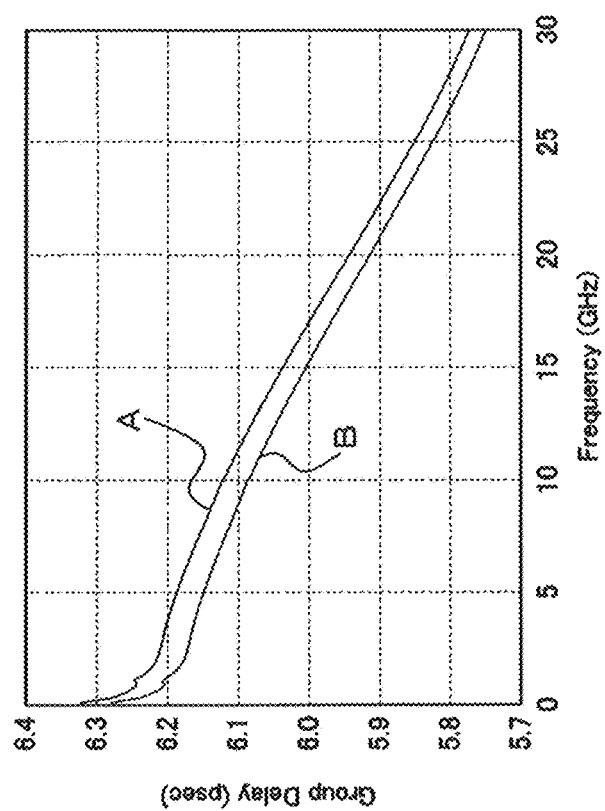
FIG. 12 is a view depicting a result of electromagnetic field analysis by the simulation apparatus according to the present embodiment.
Figure 13:
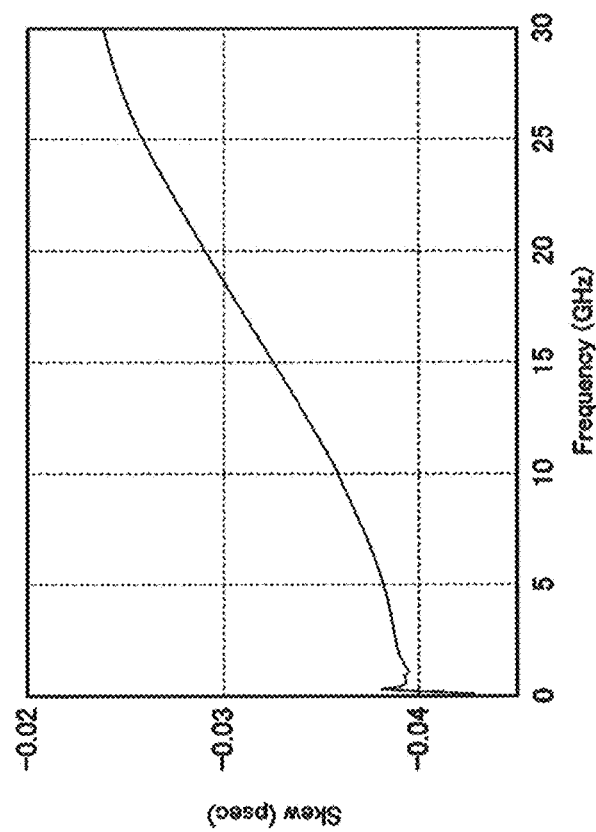
FIG. 13 is a view depicting a result of calculation of a skew by the simulation apparatus according to the present embodiment.

FIG. 12 is a view depicting a result of the electromagnetic field analysis, and FIG. 13 is a view depicting a result of the calculation of the skew.

The example depicted in FIG. 12 indicates a result of the electromagnetic field analysis in the first wiring board internal structure model 1 depicted in FIGS. 7A and 10A to 10D, and the example depicted in FIG. 13 indicates a result of the calculation of the skew in the first wiring board internal structure model 1 depicted in FIGS. 7A and 10A to 10D.

The electromagnetic field analysis is executed using the first wiring board internal structure model 1 as described above, and the frequency of a signal to be propagated on the differential lines 22 and 23 is swept from 0.1 GHz to 30 GHz at intervals of 0.1 GHz. As a result, as depicted in FIG. 12, a group delay for each frequency is displayed relating to the differential lines 22 (indicated by a solid line A in FIG. 12) and the differential lines 23 (indicated by a solid line B in FIG. 12).

Then, the group delay of the differential lines 22 (indicated by the solid line A in FIG. 12) is subtracted from the group delay of the differential lines 23 (indicated by the solid line B in FIG. 12) to calculate a skew (−0.02 psec in 30 GHz) as depicted in FIG. 13.

Then, at step S30, relating to each of a plurality of wiring board patterns 5 configured by combining the plurality of first combination patterns 3 configured by combining the plurality of first positional patterns 1X of the first wiring board internal structure model 1 corresponding to the certain line length and the plurality of second combination patterns 4 configured by combining the plurality of second positional patterns 2X of the second wiring board internal structure model corresponding to the certain line length, the skew distribution acquisition unit 53 sums the first skews of each of the plurality of first positional patterns 1X configuring each of the plurality of first combination patterns 3 and sums the second skews of each of the plurality of second positional patterns 2X configuring each of the plurality of second combination patterns 4 as depicted in FIG. 8 to calculate a total skew, and then acquires a skew distribution in the wiring board having a certain line length based on the calculated total skews.

Here, the skew distribution acquisition unit 53 extracts and combines, from among the plurality of first positional patterns 1X of the first wiring board internal structure model 1, patterns corresponding to the arbitrary line length to produce a plurality of first combination pattern 3, and sums the first skews of each of the plurality of first positional patterns 1X configuring each of the plurality of first combination patterns 3 to calculate a total skew for each of the plurality of first combination patterns 3. Further, the skew distribution acquisition unit 53 extracts and combines, from among the plurality of second positional patterns 2X of the second wiring board internal structure model 2, patterns corresponding to the arbitrary line length to produce a plurality of second combination pattern 4, and sums the second skews of each of the plurality of second positional patterns 2X configuring each of the plurality of second combination patterns 4 to calculate a total skew for each of the plurality of second combination patterns 4. Further, the skew distribution acquisition unit 53 arbitrarily extracts and combines one of the plurality of first combination patterns 3 and one of the plurality of second combination patterns 4 to produce a plurality of wiring board patterns 5, and sums a total skew of the first combination pattern 3 and a total skew of the second combination pattern 4 configuring each of the plurality of wiring board patterns 5 to calculate a total skew for each of the plurality of wiring board patterns 5. Then, the skew distribution acquisition unit 53 acquires a skew distribution in the wiring board having the certain line length based on the total skews of the plurality of wiring board patterns 5 calculated in such means as just described. Here, the skew distribution acquisition unit 53 counts the total skew of each of the plurality of wiring board patterns 5 for each of a value of the skew and acquires the skew distribution (skew statistics value) taking the value of the skew and the counted number of the skew values as the axis of abscissa and the axis of ordinate, respectively.

Then at step S40, the skew distribution display unit causes the skew distribution acquired by the skew distribution acquisition unit 53 to be displayed on a screen.

It is to be noted that, while the embodiment is described taking the case in which a wiring board having a certain line length includes one glass cloth 11 individually at the upper and lower sides of the pair of the differential lines 22 and 23 as an example, the present invention is not limited to this. For example, the present invention can be applied also to a case in which a wiring board having a certain line length includes a plurality of glass cloths 11 at the upper or lower side of the pair of differential lines 22 and 23.

For example, where a wiring board having a certain line length includes a plurality of glass cloths 11 at the upper side of the pair of differential lines 22 and 23, a total skew may be calculated in the following means. In particular, the wiring board internal structure model production unit 51 produces, as the first wiring board internal structure model 1 for the basic line length including one glass cloth (first glass cloth) 11 at the upper side of the pair of the differential lines (first differential lines) 22 and 23, a plurality of first wiring board internal structure models 1, among which the distance (distance in the thickness direction) between the pair of differential lines 22 and 23 and one glass cloth 11 differs, corresponding to the number of the glass cloths 11. Then, the skew calculation unit 52 calculates the first skew for each of the plurality of first positional patterns of the plurality of first wiring board internal structure models 1. In particular, the skew calculation unit 52 calculates, in response to the number of the glass cloths, the first skew for each of the plurality of first positional patterns of the plurality of first wiring board internal structure models among which the distance between the pair of the differential lines 22 and 23 and the glass cloth 11 differs. Then, the skew distribution acquisition unit 53 sums, as the first skew, the first skews of each of the plurality of first positional patterns 1X configuring each of the plurality of first combination patterns relating to each of the plurality of first wiring board internal structure models 1, for each of the plurality of wiring board patterns configured by combining the plurality of first combination patterns relating to each of the plurality of first wiring board internal structure models 1 as the plurality of first combination patterns, to calculate the total skew.

For example, where the wiring board having a certain line length includes two glass cloths 11 at the upper side of the pair of the differential lines 22 and 23, the total skew may be calculated in the following means. In particular, two first wiring board internal structure models 1 among which the distance (distance in the thickness direction) between the pair of the differential lines 22 and 23 and the glass cloth 11 differs are produced as the first wiring board internal structure model 1. Then, the skew calculation unit 52 performs a three-dimensional electromagnetic field analysis for each of the plurality of first positional patterns among which the relative positional relationship between the first differential lines and the glass cloth of one of the first wiring board internal structure models 1 differs to calculate the first skew appearing between the pair of first differential lines in each of the plurality of first positional patterns, and performs the three-dimensional electromagnetic field analysis for each of the plurality of first positional patterns among which the relative positional relationship between the first differential lines and the glass cloth of the other first wiring board internal structure model 1 differs to calculate the first skew appearing between the pair of first differential lines in each of the plurality of first positional patterns. Then, the skew distribution acquisition unit 53 sums, relating to each of the plurality of wiring board patterns obtained by combining the plurality of first combination patterns obtained by combining the plurality of first positional patterns of the one first wiring board internal structure model 1 corresponding to the certain line length and the plurality of first combination patterns obtained by combining the plurality of first positional patterns of the other first wiring board internal structure model 1 corresponding to the certain line length, the first skews of each of the plurality of first positional patterns 1X configuring each of the plurality of first combination patterns regarding the one first wiring board internal structure model 1 and the first skews of each of the plurality of first positional patterns 1X configuring each of the plurality of first combination patterns regarding the other first wiring board internal structure model 1 as the first skew to calculate the total skew.

On the other hand, where the wiring board having a certain line length includes a plurality of glass cloths 11 at the lower side of the pair of differential lines 22 and 23, the total skew may be calculated in the following means. In particular, the wiring board internal structure model production unit 51 produces, as the second wiring board internal structure model 2 for the basic line lines including one glass cloth (second glass cloth) 11 at the lower side of the pair of the differential lines (first differential lines) 22 and 23, a plurality of second wiring board internal structure models 2, among which the distance (distance in the thickness direction) between the pair of the differential lines 22 and 23 and one glass cloth 11 differs, corresponding to the number of the glass cloths 11. Then, the skew calculation unit 52 calculates the second skews in each of the plurality of second positional patterns of each of the plurality of second wiring board internal structure models 2. In particular, the skew calculation unit 52 calculates the second skews of each of the plurality of second positional patterns of each of the plurality of second wiring board internal structure models, among which the distance between the pair of the differential lines 22 and 23 and the glass cloth 11 differs, corresponding to the number of the glass cloths. Then, relating to each of a plurality of wiring board patterns configured by combining the plurality of second combination patterns regarding each of the plurality of second wiring board internal structure models 2 as the plurality of second combination patterns, the skew distribution acquisition unit 53 sums the second skews of each of the plurality of second positional patterns 1X configuring each of the plurality of the second combination patterns regarding each of the plurality of second wiring board internal structure models 2 to calculate the total skew.

For example, where the wiring board having a certain line length includes two glass cloths 11 at the lower side of the pair of the differential lines 22 and 23, the total skew may be calculated in the following means. The wiring board internal structure model production unit 51 produces two second wiring board internal structure models 2, among which the distance (distance in the thickness direction) between the pair of the differential lines 22 and 23 and the glass cloth 11 differs as the second wiring board internal structure model 2. Then, the skew calculation unit 52 performs the three-dimensional electromagnetic field analysis for each of the plurality of second positional patterns among which the relative positional relationship between the second differential lines and the second glass cloth of one of the second wiring board internal structure models 2 differs to calculate the second skew appearing between the pair of the second differential lines in each of the plurality of second positional patterns, and performs the three-dimensional electromagnetic field analysis for each of the plurality of second positional patterns among which the relative positional relationship between the second differential lines and the second glass cloth of the other one of the second wiring board internal structure models 2 differs to calculate the second skew appearing between the pair of the second differential lines in each of the plurality of second positional patterns. Then, the skew distribution acquisition unit 53 sums, relating to each of the plurality of wiring board patterns obtained by combining the plurality of second combination patterns obtained by combining the plurality of second positional patterns of the one second wiring board internal structure model 2 corresponding to the certain line length and the plurality of second combination patterns obtained by combining the plurality of second positional patterns of the other second wiring board internal structure model 2 corresponding to the certain line length, the second skews of each of the plurality of second positional patterns 2X configuring each of the plurality of second combination patterns regarding the one second wiring board internal structure model 2 and the second skews of each of the plurality of second positional patterns 2X configuring each of the plurality of second combination patterns regarding the other second wiring board internal structure model 2 as the second skew to calculate the total skew.

Accordingly, the simulation method and the simulation apparatus according to the present embodiment are advantageous in that the calculation cost for the electromagnetic field analysis by a three-dimensional numerical analysis tool can be suppressed and a skew distribution (skew statistics data) can be acquired with high accuracy and at a high speed.

In particular, the number of analysis specimens by the three-dimensional electromagnetic analysis can be increased while the calculation time and the calculation capacity are suppressed, and as a result, a skew distribution can be acquired with high accuracy. Consequently, a skew in the wiring board having a certain line length can be predicted.

Particularly, since the first and second wiring board internal structure models 1 and 2 individually include only a pair of differential lines 22 and 23 and one glass cloth 11, the number of meshes when the three-dimensional electromagnetic field analysis is performed using the wiring board internal structure models 1 and 2 can be suppressed to the requisite minimum. Further, since a parameter to be varied is only the position of an line, skew calculation time can be reduced and the speed of the processing can be increased. Consequently, the calculation cost for the electromagnetic field analysis by the three-dimensional numerical analysis tool can be suppressed.

Further, the skews in the plurality of positional patterns 1X and 2X of the first and second wiring board internal structure models 1 and 2 can be extracted and summed for a certain line length to calculate a total skew, and a skew distribution in the wiring board having the certain line length can be acquired in short time. Particularly, the skew distribution can be acquired with high accuracy and in short time also in a case in which the pair of the differential lines 22 and 23 are inclined with respect to the glass cloth 11.

Further, by using the first wiring board internal structure model 1 including one glass cloth 11 at the upper side of a pair of the differential lines 22 and 23 and the second wiring board internal structure model 2 including one glass cloth 11 at the lower side of a pair of the differential lines 22 and 23 as in the embodiment described hereinabove, the skew distribution can be acquired with high accuracy and the analysis accuracy of the skew can be raised also in a wiring board pattern in which the positions of the glass cloths 11 at the upper and lower sides of the pair of the differential lines 22 and 23 are displaced from each other. For example, if a wiring board internal structure model including a glass cloth one by one on both of the upper and lower sides of a pair of differential lines is used, then since the positional relationship between the upper and lower glass cloths is fixed, a skew distribution in the wiring board pattern in which the positions of the upper and lower glass cloths are displaced from each other cannot be acquired. On the other hand, by using the first wiring board internal structure model 1 including one glass cloth 11 at the upper side of the pair of the differential lines 22 and 23 and the second wiring board internal structure model 2 including one glass cloth 11 at the lower side of the pair of the differential lines 22 and 23 as in the embodiment described hereinabove, also the skew distribution in the wiring board pattern in which the positions of the upper and lower glass cloths 11 are displaced from each other can be acquired.

It is to be noted that the present invention is not limited to the configuration specifically described in the description of the embodiment, and variations and modifications can be made without departing from the scope of the present invention.

For example, the functions of the simulation apparatus and the processes of the simulation method according to the embodiment described hereinabove can be implemented by hardware, by firmware by a DSP (Digital Signal Processor) board or a CPU (Central Processing Unit) board or by software.

For example, the functions of the simulation apparatus and the processes of the simulation method according to the embodiment described hereinabove can be implemented by execution of a program by a computer (including a processor such as a CPU, an information processing apparatus and various terminals). In this case, the functions of the simulation apparatus and the processes of the simulation method according to the embodiment described hereinabove may be implemented by executing a single program or a plurality of programs. For example, the functions and the processes of the wiring board internal structure model production unit and the skew calculation unit according to the embodiment described hereinabove may be implemented by executing a three-dimensional numerical analysis tool that is a program for performing the three-dimensional electromagnetic field analysis, and the functions and the processes of the skew distribution acquisition unit according to the embodiment described hereinabove may be implemented by executing, for example, a spreadsheet software (program). Further, where the functions and the processes of the wiring board internal structure model production unit, skew calculation unit, skew distribution acquisition unit and skew distribution display unit according to the embodiment described hereinabove are implemented by executing a single program, the functions and the processes of the wiring board internal structure model production unit and the skew calculation unit according to the embodiment described above may be implemented by executing a three-dimensional numerical analysis tool based on an instruction from the single program and the functions and the processes of the skew distribution acquisition unit according to the embodiment described hereinabove may be implemented by executing, for example, a spreadsheet software based on an instruction from the single program. In this means, where the functions of the simulation apparatus and the processes of the simulation method according to the embodiment described hereinabove are implemented, since the program (one or a plurality of programs) for implementing the functions and processes is used for the simulation, the program is referred to as simulation program.

Further, where the functions of the simulation apparatus and the processes of the simulation method disclosed in the embodiment described hereinabove are implemented by execution of a program by a computer, the simulation apparatus 50 according to the embodiment described hereinabove can be implemented, for example, by a computer having such a hardware configuration as depicted in FIG. 19. In particular, the simulation apparatus 50 of the embodiment described hereinabove can be implemented by a computer having a configuration that includes a CPU 102, a memory 101, a communication controlling unit 109, an inputting apparatus 106, a display controlling apparatus 103, a display apparatus 104, a storage apparatus 105 and a drive apparatus 107 for a portable recording medium 108 and in which the components are connected to each other through a bus 110. It is to be noted that the hardware configuration of the computer as the simulation apparatus according to the embodiment described hereinabove is not limited to this.

Here, the CPU 102 controls the computer as a whole and reads out a program into the memory 101 and executes the program to perform processes necessary for the simulation apparatus of the embodiment described hereinabove.

The memory 101 is a main storage apparatus such as, for example, a RAM and temporarily stores the program or data therein when execution of the program, rewriting of data or the like is performed.

The communication controlling unit 109 (communication interface) is used for communicating with a different apparatus through a network such as, for example, a LAN or the Internet. The communication controlling unit 109 may be incorporated in the computer originally or may be implemented by an NIC (Network Interface Card) attached to the computer later.

The inputting apparatus 106 is a pointing device such as, for example, a touch panel, a mouse or the like, a key board or the like.

The display apparatus 104 is a display unit such as, for example, a liquid crystal display unit.

The display controlling unit 103 performs, for example, control for causing a skew distribution or the like to be displayed on the display apparatus 104.

The storage apparatus 105 is an auxiliary storage apparatus such as, for example, a hard disk drive (HDD), or an SSD and stores various programs and various kinds of data therein. Here, the simulation program is stored in the storage apparatus 105. It is to be noted that, for example, a ROM (Read Only Memory) may be provided as the memory 101 so that various programs or various kinds of data are stored.

The drive apparatus 107 is an apparatus for accessing to the storage contents of the portable recording medium 108 such as, for example, a semiconductor memory such as a flash memory, an optical disk or a magneto-optical disk.

In the computer having such a hardware configuration as described above, the CPU 102 reads out the simulation program stored, for example, in the storage apparatus 105 and executes the readout program to implement the functions of the simulation apparatus and the processes of the simulation method of the embodiment described hereinabove.

Further, while the simulation apparatus of the embodiment described hereinabove is configured as a computer in which the simulation program is installed, the simulation program for causing the computer to implement the functions of the simulation apparatus of the embodiment described hereinabove or the simulation program for causing the computer to execute the processes of the simulation method of the embodiment described hereinabove are sometimes provided in a state in which it is stored in a computer-readable recording medium.

Here, as the recording medium, a recording medium capable of recording a program therein such as, for example, a memory such as a semiconductor memory, a magnetic disk, an optical disk [for example, a CD (Compact Disk)-ROM, a DVD (Digital Versatile Disk) or a Blu-ray disk] or a magneto-optical disk (MO: Magneto optical Disk) is included. It is to be noted that a magnetic disk, an optical disk, a magneto-optical disk and so forth are referred to sometimes as portable recording medium.

In this case, the simulation program is readout from the portable recording medium through the drive apparatus, and the read out simulation program is installed into the storage apparatus. Consequently, the simulation apparatus and the simulation method of the embodiment described hereinabove are implemented, and, by reading out the simulation program installed in the storage apparatus into the main memory and executing the read out program similarly by the CPU as in the case described above, the functions of the simulation apparatus and the processes of the simulation method of the embodiment described hereinabove are implemented. It is to be noted that also it is possible for the computer to read out the program directly from the portable recording medium and execute the processes in accordance with the program.

Further, the simulation program for causing the computer to implement the functions of the simulation apparatus of the embodiment described hereinabove and the simulation program for causing the computer to execute the processes of the simulation method of the embodiment described hereinabove are sometimes provided, for example, through a network (the Internet, a communication circuit such as, for example, a public circuit or a dedicated circuit) as a transmission medium.

For example, a simulation program provided on a different computer such as, for example, a server by a program provider may be installed into the storage apparatus, for example, through a network such as the Internet or a LAN and a communication interface. Consequently, the simulation apparatus and the simulation method of the embodiment described hereinabove are implemented, and, by reading out the simulation program installed in the storage apparatus into the main memory and executing the read out program by the CPU similarly as in the case described above, the functions of the simulation apparatus and the processes of the simulation method of the embodiment described hereinabove are implemented. It is to be noted that also it is possible for the computer to successively execute, every time a program is transferred from a different computer such as, for example, a server, the processes in accordance with the received program.

Further, the configuration example is described herein taking, as an example, a case in which the present simulation apparatus is implemented as a single apparatus having the hardware configuration of the CPU 102, memory 101, communication controlling unit 109, inputting apparatus 106, display controlling unit 103, display apparatus 104, storage apparatus 105, drive apparatus 107 for the portable recording medium 108 and so forth, the simulation apparatus is not limited to this. For example, only if the functions of the simulation apparatus and the processes of the simulation method of the embodiment described hereinabove are implemented, the simulation apparatus may not be implemented by a single apparatus, but a system or an integrated apparatus configured from a plurality of apparatus or a system in which the processes are performed through a network such as a LAN, a WAN or the like may be applied. For example, a server such as a cloud server may be configured as a system for implementing the functions of the simulation apparatus and the processes of the simulation method of the embodiment described hereinabove such that it can be utilized through a computer network like the Internet or an intranet.

Further, the configuration example is described herein taking, as an example, a case in which, by executing the program read out into the memory by the CPU in the computer, the functions of the simulation apparatus and the processes of the simulation method of the embodiment described hereinabove are implemented, the configuration is not limited to this. For example, part or all of actual processes may be performed by the OS or the like operating in the computer based on an instruction of the program so that the functions of the simulation apparatus and the processes of the simulation method of the embodiment described hereinabove are implemented. Further, the program read out from the portable recording medium or the program (data) provided from the program (data) provider may be written into a memory provided in a function expansion board inserted in the computer or in a function expansion unit connected to the computer, and part or all of the actual processes may be performed by a CPU or the like provided in the function expansion board or the function expansion unit based on an instruction of the program so that the functions of the simulation apparatus and the processes of the simulation method of the embodiment described hereinabove are implemented.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A simulation method comprising:

producing, by a processor, a first wiring board internal structure model for a basic line length including one first glass cloth at the upper side of a pair of first differential lines by modeling an internal structure of a wiring board using a three-dimensional numerical analysis program, and producing, by a processor, a second wiring board internal structure model for a basic line length including one second glass cloth at the lower side of a pair of second differential lines by modeling an internal structure of a wiring board using a three-dimensional numerical analysis program;

producing, by a processor, a plurality of first positional patterns having different relative positional relationships between the first differential lines and the first glass cloth by varying relative positional relationships between the first differential lines and the first glass cloth of the first wiring board internal structure model using a three-dimensional numerical analysis program, and producing, by a processor, a plurality of second positional patterns having different relative positional relationships between the second differential lines and the second glass cloth by varying relative positional relationships between the second differential lines and the second glass cloth of the second wiring board internal structure model using a three-dimensional numerical analysis program;

calculating, by a processor, by performing a three-dimensional electromagnetic field analysis using a three-dimensional numerical analysis program for each of the plurality of first positional patterns, a first skew generated between the pair of first differential lines in each of the plurality of first positional patterns, and calculating, by a processor, by performing a three-dimensional electromagnetic field analysis using a three-dimensional numerical analysis program for each of the plurality of second positional patterns, a second skew generated between the pair of second differential lines in each of the plurality of second positional patterns; and calculating, by a processor, for each of a plurality of wiring board patterns configured by combining a plurality of first combination patterns individually configured by combining the plurality of first positional patterns of the first wiring board internal structure model for a certain line length and a plurality of second combination patterns individually configured by combining the plurality of second positional patterns of the second wiring board internal structure model for a certain line length, a total skew by adding a sum of the first skews obtained by summing the first skew of each of the plurality of first positional patterns configuring each of the plurality of first combination patterns to a sum of the second skews obtained by summing the second skew of each of the plurality of second positional patterns configuring each of the plurality of second combination patterns, and then acquiring a skew distribution in a wiring board having a certain line length based on the calculated total skews.

2. The simulation method according to claim 1, wherein the first wiring board internal structure model for the basic line length has a length of one cycle or a plurality of cycles of a glass fiber bundle, which configures the first glass cloth, in a direction in which the first differential lines extend; and the second wiring board internal structure model for the basic line has a length of one cycle or a plurality of cycles of a glass fiber bundle, which configures the second glass cloth, in a direction in which the second differential lines extend.

3. The simulation method according to claim 1, wherein the first wiring board internal structure model has a length of one cycle or a plurality of cycles of a glass fiber bundle, which configures the first glass cloth, in a direction orthogonal to a direction in which the first differential lines extend; and the second wiring board internal structure model has a length of one cycle or a plurality of cycles of a glass fiber bundle, which configures the second glass cloth, in a direction orthogonal to a direction in which the second differential lines extend.

4. The simulation method according to claim 1, wherein, where the wiring board having the certain line length includes a plurality of glass clothes at the upper side of the pair of differential lines, calculating, in the calculating the first skew and the second skew, the first skew in each of the plurality of first positional patterns of each of a plurality of first wiring board internal structure models between which a distance between the first differential lines and the first glass cloth differs in accordance with the number of glass clothes; and calculating, in the acquiring the skew distribution, a total skew by summing, for each of the plurality of wiring board patterns configured by combining the plurality of first combination patterns of each of the plurality of first wiring board internal structure models as the plurality of first combination patterns, the first skew of each of the plurality of first positional patterns configuring each of the plurality of first combination patterns of each of the plurality of first wiring board internal structure models as the first skew.

5. The simulation method according to claim 1, wherein, where the wiring board having the certain line length includes a plurality of glass clothes at the lower side of the pair of differential lines, calculating, in the calculating the first skew and the second skew, the second skew in each of the plurality of second positional patterns of each of a plurality of second wiring board internal structure models between which a distance between the second differential lines and the second glass cloth differs in accordance with the number of glass clothes; and calculating, in the acquiring the skew distribution, a total skew by summing, for each of the plurality of wiring board patterns configured by combining the plurality of second combination patterns of each of the plurality of second wiring board internal structure models as the plurality of second combination patterns, the second skew of each of the plurality of second positional patterns configuring each of the plurality of second combination patterns of each of the plurality of second wiring board internal structure models as the second skew.

6. A non-transitory computer-readable recording medium having stored therein a simulation program for causing a computer to execute a simulation process comprising:

producing, by a processor, a first wiring board internal structure model for a basic line length including one first glass cloth at the upper side of a pair of first differential lines by modeling an internal structure of a wiring board using a three-dimensional numerical analysis program, and producing, by a processor, a second wiring board internal structure model for a basic line length including one second glass cloth at the lower side of a pair of second differential lines by modeling an internal structure of a wiring board using a three-dimensional numerical analysis program;

producing, by a processor, a plurality of first positional patterns having different relative positional relationships between the first differential lines and the first glass cloth by varying relative positional relationships between the first differential lines and the first glass cloth of the first wiring board internal structure model using a three-dimensional numerical analysis program, and producing, by a processor, a plurality of second positional patterns having different relative positional relationships between the second differential lines and the second glass cloth by varying relative positional relationships between the second differential lines and the second glass cloth of the second wiring board internal structure model using a three-dimensional numerical analysis program;

calculating, by a processor, by performing a three-dimensional electromagnetic field analysis using a three-dimensional numerical analysis program for each of the plurality of first positional patterns, a first skew generated between the pair of first differential lines in each of the plurality of first positional patterns, and calculating, by a processor, by performing a three-dimensional electromagnetic field analysis using a three-dimensional numerical analysis program for each of the plurality of second positional patterns, a second skew generated between the pair of second differential lines in each of the plurality of second positional patterns; and calculating, by a processor, for each of a plurality of wiring board patterns configured by combining a plurality of first combination patterns individually configured by combining the plurality of first positional patterns of the first wiring board internal structure model for a certain line length and a plurality of second combination patterns individually configured by combining the plurality of second positional patterns of the second wiring board internal structure model for a certain line length, a total skew by adding a sum of the first skews obtained by summing the first skew of each of the plurality of first positional patterns configuring each of the plurality of first combination patterns to a sum of the second skews obtained by summing the second skew of each of the plurality of second positional patterns configuring each of the plurality of second combination patterns, and then acquiring a skew distribution in a wiring board having a certain line length based on the calculated total skews.

7. The non-transitory computer-readable recording medium having stored therein a simulation program according to claim 6, wherein the first wiring board internal structure model for the basic line length has a length of one cycle or a plurality of cycles of a glass fiber bundle, which configures the first glass cloth, in a direction in which the first differential lines extend; and the second wiring board internal structure model for the basic line has a length of one cycle or a plurality of cycles of a glass fiber bundle, which configures the second glass cloth, in a direction in which the second differential lines extend.

8. The non-transitory computer-readable recording medium having stored therein a simulation program according to claim 6, wherein the first wiring board internal structure model has a length of one cycle or a plurality of cycles of a glass fiber bundle, which configures the first glass cloth, in a direction orthogonal to a direction in which the first differential lines extend; and the second wiring board internal structure model has a length of one cycle or a plurality of cycles of a glass fiber bundle, which configures the second glass cloth, in a direction orthogonal to a direction in which the second differential lines extend.

9. The non-transitory computer-readable recording medium having stored therein a simulation program according to claim 6, wherein, where the wiring board having the certain line length includes a plurality of glass clothes at the upper side of the pair of differential lines, calculating, in the calculating the first skew and the second skew, the first skew in each of the plurality of first positional patterns of each of a plurality of first wiring board internal structure models between which a distance between the first differential lines and the first glass cloth differs in accordance with the number of glass clothes; and calculating, in the acquiring the skew distribution, a total skew by summing, for each of the plurality of wiring board patterns configured by combining the plurality of first combination patterns of each of the plurality of first wiring board internal structure models as the plurality of first combination patterns, the first skew of each of the plurality of first positional patterns configuring each of the plurality of first combination patterns of each of the plurality of first wiring board internal structure models as the first skew.

10. The non-transitory computer-readable recording medium having stored therein a simulation program according to claim 6, wherein, where the wiring board having the certain line length includes a plurality of glass clothes at the lower side of the pair of differential lines, calculating, in the calculating the first skew and the second skew, the second skew in each of the plurality of second positional patterns of each of a plurality of second wiring board internal structure models between which a distance between the second differential lines and the second glass cloth differs in accordance with the number of glass clothes; and calculating, in the acquiring the skew distribution, a total skew by summing, for each of the plurality of wiring board patterns configured by combining the plurality of second combination patterns of each of the plurality of second wiring board internal structure models as the plurality of second combination patterns, the second skew of each of the plurality of second positional patterns configuring each of the plurality of second combination patterns of each of the plurality of second wiring board internal structure models as the second skew.

11. A simulation apparatus, comprising:

a processor;

wherein the processor configured to execute a process including:

producing a first wiring board internal structure model for a basic line length including one first glass cloth at the upper side of a pair of first differential lines by modeling an internal structure of a wiring board using a three-dimensional numerical analysis program, and producing a second wiring board internal structure model for a basic line length including one second glass cloth at the lower side of a pair of second differential lines by modeling an internal structure of a wiring board using a three-dimensional numerical analysis program;

producing a plurality of first positional patterns having different relative positional relationships between the first differential lines and the first glass cloth by varying relative positional relationships between the first differential lines and the first glass cloth of the first wiring board internal structure model using a three-dimensional numerical analysis program, and producing a plurality of second positional patterns having different relative positional relationships between the second differential lines and the second glass cloth by varying relative positional relationships between the second differential lines and the second glass cloth of the second wiring board internal structure model using a three-dimensional numerical analysis program;

calculating, by performing a three-dimensional electromagnetic field analysis using a three-dimensional numerical analysis program for each of the plurality of first positional patterns, a first skew generated between the pair of first differential lines in each of the plurality of first positional patterns, and calculating, by performing a three-dimensional electromagnetic field analysis using a three-dimensional numerical analysis program for each of the plurality of second positional patterns, a second skew generated between the pair of second differential lines in each of the plurality of second positional patterns; and calculating, for each of a plurality of wiring board patterns configured by combining a plurality of first combination patterns individually configured by combining the plurality of first positional patterns of the first wiring board internal structure model for a certain line length and a plurality of second combination patterns individually configured by combining the plurality of second positional patterns of the second wiring board internal structure model for a certain line length, a total skew by adding a sum of the first skews obtained by summing the first skew of each of the plurality of first positional patterns configuring each of the plurality of first combination patterns to a sum of the second skews obtained by summing the second skew of each of the plurality of second positional patterns configuring each of the plurality of second combination patterns, and then acquires a skew distribution in a wiring board having a certain line length based on the calculated total skews.

12. The simulation apparatus according to claim 11, wherein the first wiring board internal structure model for the basic line length has a length of one cycle or a plurality of cycles of a glass fiber bundle, which configures the first glass cloth, in a direction in which the first differential lines extend; and the second wiring board internal structure model for the basic line has a length of one cycle or a plurality of cycles of a glass fiber bundle, which configures the second glass cloth, in a direction in which the second differential lines extend.

13. The simulation apparatus according to claim 11, wherein the first wiring board internal structure model has a length of one cycle or a plurality of cycles of a glass fiber bundle, which configures the first glass cloth, in a direction orthogonal to a direction in which the first differential lines extend; and the second wiring board internal structure model has a length of one cycle or a plurality of cycles of a glass fiber bundle, which configures the second glass cloth, in a direction orthogonal to a direction in which the second differential lines extend.

14. The simulation apparatus according to claim 11, wherein, where the wiring board having the certain line length includes a plurality of glass clothes at the upper side of the pair of differential lines, calculating, in the calculating the first skew and the second skew, the first skew in each of the plurality of first positional patterns of each of a plurality of first wiring board internal structure models between which a distance between the first differential lines and the first glass cloth differs in accordance with the number of glass clothes; and calculating, in the acquiring the skew distribution, a total skew by summing, for each of the plurality of wiring board patterns configured by combining the plurality of first combination patterns of each of the plurality of first wiring board internal structure models as the plurality of first combination patterns, the first skew of each of the plurality of first positional patterns configuring each of the plurality of first combination patterns of each of the plurality of first wiring board internal structure models as the first skew.

15. The simulation apparatus according to claim 11, wherein, where the wiring board having the certain line length includes a plurality of glass clothes at the lower side of the pair of differential lines, calculating, in the calculating the first skew and the second skew, the second skew in each of the plurality of second positional patterns of each of a plurality of second wiring board internal structure models between which a distance between the second differential lines and the second glass cloth differs in accordance with the number of glass clothes; and calculating, in the acquiring the skew distribution, a total skew by summing, for each of the plurality of wiring board patterns configured by combining the plurality of second combination patterns of each of the plurality of second wiring board internal structure models as the plurality of second combination patterns, the second skew of each of the plurality of second positional patterns configuring each of the plurality of second combination patterns of each of the plurality of second wiring board internal structure models as the second skew.

16. The simulation apparatus according to claim 11, wherein the process further including causing the skew distribution acquired in the acquiring the skew distribution to be displayed on a screen.

* * * * *